United States Patent
Sommer

(10) Patent No.: US 10,845,375 B2
(45) Date of Patent: Nov. 24, 2020

(54) THERMAL STABILIZATION OF INERTIAL MEASUREMENT UNITS

(71) Applicant: AGJUNCTION LLC, Hiawatha, KS (US)

(72) Inventor: Jeremy Sinclair Sommer, Mountain View, CA (US)

(73) Assignee: AGJUNCTION LLC, Scottsdale, AZ (US)

( * ) Notice: Subject to any disclaimer, the term of this patent is extended or adjusted under 35 U.S.C. 154(b) by 794 days.

(21) Appl. No.: 15/420,910

(22) Filed: Jan. 31, 2017

(65) Prior Publication Data

US 2017/0242048 A1   Aug. 24, 2017

Related U.S. Application Data

(60) Provisional application No. 62/297,712, filed on Feb. 19, 2016.

(51) Int. Cl.
| | |
|---|---|
| G01P 1/00 | (2006.01) |
| G01C 21/16 | (2006.01) |
| G05D 23/19 | (2006.01) |
| G01C 25/00 | (2006.01) |
| F25B 21/00 | (2006.01) |
| F25B 21/04 | (2006.01) |
| F25B 21/02 | (2006.01) |
| H01L 37/00 | (2006.01) |
| H01L 35/00 | (2006.01) |
| H01M 10/613 | (2014.01) |

(Continued)

(52) U.S. Cl.
CPC .............. *G01P 1/006* (2013.01); *F25B 21/00* (2013.01); *F25B 21/02* (2013.01); *F25B 21/04* (2013.01);

(Continued)

(58) Field of Classification Search
CPC ................................ H01L 37/00; H01L 35/00
See application file for complete search history.

(56) References Cited

U.S. PATENT DOCUMENTS

3,651,383 A * 3/1972 Livezey ................ H01L 23/051
257/727
3,751,800 A * 8/1973 Daniels .................... H01L 21/50
29/860

(Continued)

FOREIGN PATENT DOCUMENTS

CA    2661385 A1 * 2/2008    ......... H01L 23/3121
DE    3346833 C2 * 12/1986    ........... H01L 23/051

(Continued)

OTHER PUBLICATIONS

Precise Temperature Control Hadia et al (Jun. 2015) (Year: 2015).*

(Continued)

*Primary Examiner* — Len Tran
*Assistant Examiner* — Jenna M Hopkins
(74) *Attorney, Agent, or Firm* — Schwabe Williamson & Wyatt

(57) ABSTRACT

A thermal stabilization system stabilizes inertial measurement unit (IMU) performance by reducing or slowing operating variations over time of the internal temperature. More specifically, a thermoelectric heating/cooling device operates according to the Peltier effect, and uses thermal insulation and a mechanical assembly to thermally and mechanically couple the IMU to the thermoelectric device. The thermal stabilization system may minimize stress on the IMU and use a control system to stabilize internal IMU temperatures by judiciously and bidirectionally powering the thermoelectric heating/cooling device. The thermal stabilization system also may use compensation algorithms to reduce or counter residual IMU output errors from a variety of causes such as thermal gradients and imperfect colocation of the IMU temperature sensor with inertial sensors.

12 Claims, 13 Drawing Sheets

(51) Int. Cl.
*H01L 23/051* (2006.01)
*G01P 15/02* (2013.01)

(52) U.S. Cl.
CPC ............ *G01C 21/16* (2013.01); *G01C 25/00* (2013.01); *G01P 15/02* (2013.01); *G05D 23/1917* (2013.01); *H01L 23/051* (2013.01); *H01L 35/00* (2013.01); *H01L 37/00* (2013.01); *H01M 10/613* (2015.04); *F25B 2321/00* (2013.01); *F25B 2321/001* (2013.01); *F25B 2321/02* (2013.01); *F25B 2321/021* (2013.01); *F25B 2321/023* (2013.01)

(56) References Cited

U.S. PATENT DOCUMENTS

| | | | | |
|---|---|---|---|---|
| 3,772,764 | A * | 11/1973 | Furnival | B23K 20/02 228/115 |
| 3,786,168 | A * | 1/1974 | Jaecklin | H01L 23/051 174/16.3 |
| 4,066,365 | A * | 1/1978 | Staunton | F25B 21/02 165/289 |
| 4,333,519 | A * | 6/1982 | Shafrir | G05D 23/1902 165/259 |
| 4,383,414 | A * | 5/1983 | Beitner | F25B 21/02 62/3.6 |
| 4,474,015 | A * | 10/1984 | Christmas | A01N 1/00 62/3.2 |
| 4,631,728 | A * | 12/1986 | Simons | H01S 5/02415 372/34 |
| 5,040,381 | A * | 8/1991 | Hazen | F25B 21/02 136/204 |
| 5,088,098 | A * | 2/1992 | Muller | H01S 5/02415 165/253 |
| 5,118,964 | A * | 6/1992 | McArdle | G05D 23/1919 307/117 |
| 5,194,851 | A | 3/1993 | Kraning et al. | |
| 5,390,125 | A | 2/1995 | Sennott et al. | |
| 5,398,510 | A * | 3/1995 | Gilley | F25B 21/02 62/3.6 |
| 5,450,727 | A * | 9/1995 | Ramirez | F25B 21/02 165/259 |
| 5,515,682 | A * | 5/1996 | Nagakubo | F25B 21/04 165/259 |
| 5,522,215 | A * | 6/1996 | Matsunaga | F25B 21/02 62/3.2 |
| 5,584,183 | A * | 12/1996 | Wright | F25B 21/02 165/58 |
| 5,602,860 | A * | 2/1997 | Masonson | H01S 5/02415 372/25 |
| 5,663,879 | A | 9/1997 | Trovato et al. | |
| 5,690,849 | A * | 11/1997 | DeVilbiss | G05D 23/1913 219/209 |
| 5,708,256 | A * | 1/1998 | Montagnino | G05D 23/1913 219/212 |
| 5,865,031 | A * | 2/1999 | Itakura | F25B 21/02 62/3.7 |
| 5,923,270 | A | 7/1999 | Sampo et al. | |
| 6,052,647 | A | 4/2000 | Parkinson et al. | |
| 6,070,673 | A | 6/2000 | Wendte | |
| 6,094,919 | A * | 8/2000 | Bhatia | H01L 23/38 165/104.21 |
| 6,098,408 | A * | 8/2000 | Levinson | F25B 21/02 62/3.2 |
| 6,205,790 | B1 * | 3/2001 | Denkin | G05D 23/1912 165/255 |
| 6,212,453 | B1 | 4/2001 | Kawagoe et al. | |
| 6,373,432 | B1 | 4/2002 | Rabinowitz et al. | |
| 6,377,889 | B1 | 4/2002 | Soest | |
| 6,445,983 | B1 | 9/2002 | Dickson et al. | |
| 6,519,949 | B1 * | 2/2003 | Wernlund | F25B 21/02 372/34 |
| 6,539,303 | B2 | 3/2003 | McClure et al. | |
| 6,574,967 | B1 * | 6/2003 | Park | F25B 21/02 62/3.3 |
| 6,675,072 | B1 * | 1/2004 | Kerem | G05D 23/1931 62/3.6 |
| 6,711,501 | B2 | 3/2004 | McClure et al. | |
| 6,748,747 | B2 * | 6/2004 | Hoschek | F25B 21/02 62/3.7 |
| 6,778,908 | B2 | 8/2004 | Mortorana et al. | |
| 6,789,014 | B1 | 9/2004 | Rekow et al. | |
| 6,817,191 | B2 * | 11/2004 | Watanabe | B41J 2/04528 62/3.1 |
| 6,819,780 | B2 | 11/2004 | Benson et al. | |
| 6,865,465 | B2 | 3/2005 | McClure | |
| 6,876,920 | B1 | 4/2005 | Mailer | |
| 6,981,381 | B1 * | 1/2006 | Wang | F25B 21/04 62/3.2 |
| 7,082,772 | B2 * | 8/2006 | Welch | F25B 21/04 257/E23.082 |
| 7,124,592 | B2 * | 10/2006 | Tanaka | F25B 21/04 62/3.2 |
| 7,142,956 | B2 | 11/2006 | Heiniger et al. | |
| 7,162,348 | B2 | 1/2007 | McClure et al. | |
| 7,277,792 | B2 | 10/2007 | Overschie | |
| 7,373,231 | B2 | 5/2008 | McClure et al. | |
| 7,400,956 | B1 | 7/2008 | Feller et al. | |
| 7,437,230 | B2 | 10/2008 | McClure | |
| 7,460,942 | B2 | 12/2008 | Mailer | |
| 7,689,354 | B2 | 3/2010 | Heiniger et al. | |
| RE41,358 | E | 5/2010 | Heiniger et al. | |
| 7,835,832 | B2 | 11/2010 | Macdonald et al. | |
| 7,885,745 | B2 | 2/2011 | McClure et al. | |
| 8,018,376 | B2 | 9/2011 | McClure et al. | |
| 8,064,197 | B2 * | 11/2011 | Mowry | G06F 1/206 361/679.53 |
| 8,190,337 | B2 | 5/2012 | McClure | |
| 8,214,111 | B2 | 7/2012 | Heiniger et al. | |
| 8,237,387 | B2 * | 8/2012 | Tan | G05D 23/1919 318/472 |
| 8,311,696 | B2 | 11/2012 | Reeve | |
| 8,386,129 | B2 | 2/2013 | Collins et al. | |
| 8,401,704 | B2 | 3/2013 | Pollock et al. | |
| 8,489,291 | B2 | 7/2013 | Dearborn et al. | |
| 8,521,372 | B2 | 8/2013 | Hunt et al. | |
| 8,548,649 | B2 | 10/2013 | Guyette et al. | |
| 8,583,315 | B2 | 11/2013 | Whitehead et al. | |
| 8,583,326 | B2 | 11/2013 | Collins et al. | |
| 8,589,013 | B2 | 11/2013 | Pieper et al. | |
| 8,594,879 | B2 | 11/2013 | Roberge et al. | |
| 8,634,993 | B2 | 1/2014 | McClure et al. | |
| 8,639,416 | B2 | 1/2014 | Jones et al. | |
| 8,649,930 | B2 | 2/2014 | Reeve et al. | |
| 8,676,620 | B2 | 3/2014 | Hunt et al. | |
| 8,695,353 | B2 * | 4/2014 | Casasanta | F25B 21/00 62/3.1 |
| 8,718,874 | B2 | 5/2014 | McClure et al. | |
| 8,768,558 | B2 | 7/2014 | Reeve et al. | |
| 8,781,685 | B2 | 7/2014 | McClure | |
| 8,803,735 | B2 | 8/2014 | McClure | |
| 8,897,973 | B2 | 11/2014 | Hunt et al. | |
| 8,924,152 | B2 | 12/2014 | Hunt et al. | |
| 9,002,565 | B2 | 4/2015 | Jones et al. | |
| 9,002,566 | B2 | 4/2015 | McClure et al. | |
| 9,141,111 | B2 | 9/2015 | Webber et al. | |
| 9,162,703 | B2 | 10/2015 | Miller et al. | |
| 9,173,337 | B2 | 11/2015 | Guyette et al. | |
| 9,223,314 | B2 | 12/2015 | McClure et al. | |
| 9,255,992 | B2 | 2/2016 | McClure | |
| 9,389,615 | B2 | 7/2016 | Webber et al. | |
| 9,685,599 | B2 * | 6/2017 | Petrovski | H01L 35/00 |
| 9,739,512 | B2 * | 8/2017 | Rao | F25B 21/02 |
| 2001/0013224 | A1 * | 8/2001 | Ohkubo | F25B 21/04 62/3.7 |
| 2002/0072850 | A1 | 6/2002 | McClure et al. | |
| 2002/0105008 | A1 * | 8/2002 | Taguchi | H01L 23/051 257/138 |
| 2003/0033818 | A1 * | 2/2003 | Kucherov | F25B 21/02 62/3.1 |

(56) References Cited

U.S. PATENT DOCUMENTS

| | | | |
|---|---|---|---|
| 2003/0152390 A1* | 8/2003 | Stewart | H04B 10/40 398/135 |
| 2003/0154723 A1* | 8/2003 | Lin | F25B 21/02 62/3.2 |
| 2003/0172657 A1* | 9/2003 | Ohkubo | F25B 21/04 62/3.3 |
| 2003/0182959 A1* | 10/2003 | McKeown | F25B 21/04 62/259.2 |
| 2004/0186644 A1 | 9/2004 | McClure et al. | |
| 2005/0011199 A1* | 1/2005 | Grisham | F25B 21/02 62/3.7 |
| 2005/0189871 A1* | 9/2005 | Tavkhelidze | H01J 19/42 313/498 |
| 2005/0207459 A1* | 9/2005 | Yu | F25B 21/02 372/36 |
| 2005/0235652 A1* | 10/2005 | Iwasaki | F25B 21/02 62/3.7 |
| 2006/0005548 A1* | 1/2006 | Ruckstuhl | A47B 77/08 62/3.2 |
| 2006/0100781 A1 | 5/2006 | Lin | |
| 2006/0167600 A1 | 7/2006 | Nelson, Jr. et al. | |
| 2007/0064460 A1* | 3/2007 | Siman-Tov | H02M 3/157 363/132 |
| 2007/0157628 A1* | 7/2007 | Onoue | F25B 21/02 62/3.2 |
| 2008/0106293 A1* | 5/2008 | Hashimoto | H01L 35/28 324/750.11 |
| 2008/0173023 A1* | 7/2008 | Wu | F25B 21/02 62/3.6 |
| 2008/0178920 A1* | 7/2008 | Ullo | E21B 47/011 136/204 |
| 2008/0184710 A1* | 8/2008 | DeVilbiss | F25B 21/02 62/3.2 |
| 2008/0236175 A1* | 10/2008 | Chaparro Monferrer | F25B 21/02 62/3.2 |
| 2008/0251125 A1* | 10/2008 | Cheng | F24F 5/0042 136/259 |
| 2008/0264464 A1* | 10/2008 | Lee | A61F 7/007 136/201 |
| 2008/0311466 A1 | 12/2008 | Yang | |
| 2009/0084112 A1* | 4/2009 | Ham | F02B 29/0481 62/3.2 |
| 2010/0274452 A1 | 10/2010 | Ringwald et al. | |
| 2010/0290184 A1* | 11/2010 | Tani | F25B 21/02 361/679.54 |
| 2011/0107770 A1* | 5/2011 | Oksanen | F25B 21/00 62/3.1 |
| 2011/0113791 A1* | 5/2011 | Kruglick | F25B 21/00 62/3.1 |
| 2011/0127365 A1 | 6/2011 | Chappell | |
| 2011/0212624 A1* | 9/2011 | Hudson | H01J 37/32596 438/710 |
| 2011/0264427 A1 | 10/2011 | Shumaker | |
| 2011/0302930 A1* | 12/2011 | Sohn | F25B 21/00 62/3.1 |
| 2012/0023970 A1* | 2/2012 | Lee | F24H 1/142 62/3.2 |
| 2012/0042661 A1* | 2/2012 | Danenberg | F25B 21/02 62/3.2 |
| 2012/0119372 A1* | 5/2012 | Yasukawa | H01L 21/563 257/773 |
| 2012/0169053 A1* | 7/2012 | Tchoryk, Jr. | G01P 5/26 290/44 |
| 2012/0176296 A1* | 7/2012 | Border | G02B 27/2228 345/8 |
| 2012/0240882 A1* | 9/2012 | Gao | B60K 11/02 123/41.55 |
| 2012/0253735 A1* | 10/2012 | Hyde | F04D 29/586 702/130 |
| 2013/0017421 A1* | 1/2013 | Onnerud | B60R 21/01 429/61 |
| 2013/0067935 A1* | 3/2013 | Kruglick | F25B 21/00 62/3.2 |
| 2013/0072035 A1* | 3/2013 | Gaff | F25B 21/04 438/798 |
| 2013/0128915 A1* | 5/2013 | Aschauer | F28F 13/00 374/8 |
| 2013/0152604 A1* | 6/2013 | Mimata | H01L 21/67017 62/3.3 |
| 2013/0152605 A1* | 6/2013 | Mimata | F25B 21/04 62/3.3 |
| 2013/0174577 A1* | 7/2013 | Brija | F25B 21/04 62/3.2 |
| 2013/0221526 A1* | 8/2013 | Lange | H01L 21/50 257/750 |
| 2013/0239589 A1* | 9/2013 | Mahalingam | H01L 23/467 62/3.2 |
| 2013/0291559 A1* | 11/2013 | June | F25B 21/00 62/3.2 |
| 2013/0340525 A1* | 12/2013 | Liu | G01P 15/0802 73/514.11 |
| 2014/0020405 A1* | 1/2014 | Kruglick | F25B 21/02 62/3.2 |
| 2014/0032034 A1* | 1/2014 | Raptopoulos | G08G 5/0069 701/25 |
| 2014/0035815 A1* | 2/2014 | Huang | G06F 3/016 345/158 |
| 2014/0223922 A1* | 8/2014 | Ayotte | F25B 21/00 62/3.1 |
| 2014/0251404 A1* | 9/2014 | Converse | H01L 35/30 136/205 |
| 2014/0266877 A1 | 9/2014 | McClure | |
| 2014/0277676 A1 | 9/2014 | Gattis | |
| 2015/0007583 A1* | 1/2015 | Murata | B60L 1/06 62/3.2 |
| 2015/0007973 A1* | 1/2015 | Yu | G05D 23/1919 165/254 |
| 2015/0040584 A1* | 2/2015 | Takei | G05D 23/1919 62/3.7 |
| 2015/0059358 A1* | 3/2015 | Chang | F25B 21/02 62/3.2 |
| 2015/0075186 A1* | 3/2015 | Prajapati | G06F 1/20 62/3.7 |
| 2015/0107268 A1* | 4/2015 | Han | F25B 21/02 62/3.3 |
| 2015/0175194 A1 | 6/2015 | Gattis | |
| 2015/0223731 A1* | 8/2015 | Sahin | A61B 5/16 600/301 |
| 2015/0233605 A1* | 8/2015 | Bernhardt | G06F 9/5094 236/1 F |
| 2015/0262134 A1* | 9/2015 | Daley | G06Q 10/20 705/305 |
| 2015/0274512 A1* | 10/2015 | Xu | B81B 7/0074 257/417 |
| 2016/0025388 A1* | 1/2016 | Wait | F25B 21/04 62/3.3 |
| 2016/0039454 A1 | 2/2016 | Mortimer | |
| 2016/0154108 A1 | 6/2016 | McClure et al. | |
| 2016/0205864 A1 | 7/2016 | Gattis et al. | |
| 2016/0214643 A1 | 7/2016 | Joughin et al. | |
| 2016/0233851 A1* | 8/2016 | Horning | H03K 3/011 |
| 2016/0252909 A1 | 9/2016 | Webber et al. | |
| 2016/0334804 A1 | 11/2016 | Webber et al. | |
| 2017/0242463 A1* | 8/2017 | Matteson | G06F 1/206 |
| 2018/0013176 A1* | 1/2018 | Roy-Mayhew | H01M 2/1022 |
| 2018/0031422 A1* | 2/2018 | Murphy | G01J 3/0291 |
| 2018/0257457 A1* | 9/2018 | Olson | B60N 2/5685 |
| 2020/0113490 A1* | 4/2020 | Ogasawara | A61B 5/1116 |

FOREIGN PATENT DOCUMENTS

| | | | | |
|---|---|---|---|---|
| DE | 10048859 A1 | * | 4/2002 | H01L 23/051 |
| EP | 0285074 A2 | * | 10/1988 | H01L 23/051 |
| EP | 2738484 A2 | * | 6/2014 | |
| FR | 2801423 A1 | * | 5/2001 | H01L 23/051 |
| JP | 11186617 A | * | 7/1999 | H01L 35/32 |
| JP | 2930074 B1 | * | 8/1999 | H01L 23/051 |

(56) References Cited

FOREIGN PATENT DOCUMENTS

| WO | WO-03090245 A1 * | 10/2003 | ............ H01J 45/00 |
|----|------------------|---------|------------------------|
| WO | 2008/024821 A2 | 2/2008 | |
| WO | WO-2011083462 A2 * | 7/2011 | ............ F25B 21/02 |
| WO | WO-2012106111 A2 * | 8/2012 | ........... H05K 1/0203 |
| WO | WO-2013004297 A1 * | 10/2013 | |
| WO | WO-2015178929 A1 * | 11/2015 | |

OTHER PUBLICATIONS

Compensation of Dead Time in PID Controllers—Fisher Rosemount (2007) (Year: 2007).*

International Preliminary Report on Patentability for PCT/US2017/016470; dated Aug. 30, 2018; 9 pages.

Noh, Kwang-Mo, Self-tuning controller for farm tractor guidance, Iowa State University Retrospective Theses and Dissertations, Paper 9874, (1990).

Van Zuydam,. R.P., Centimeter-Precision Guidance of Agricultural Implements in the Open Field by Means of Real Tim Kinematic DGPS, ASA-CSSA-SSSA, pp. 1023-1034 (1999).

International Search Report and Written Opinion; PCTUS2017/016470; dated Apr. 18, 2017.

William, Jim, "A Thermoelectric Cooler Temperature Controller for Fiber Optic Lasers, Climatic Pampering for Temperamental Lasers", Linear Technology, Application Note 89, Apr. 2001, pp. 1-12.

Borenstein et al., "Personal Dead-Reckoning System", Final Report for CCAT Program 1401, University of Michigan, Sep. 28, 2010, pp. 1-18.

* cited by examiner

DUTY CYCLE COMPENSATION

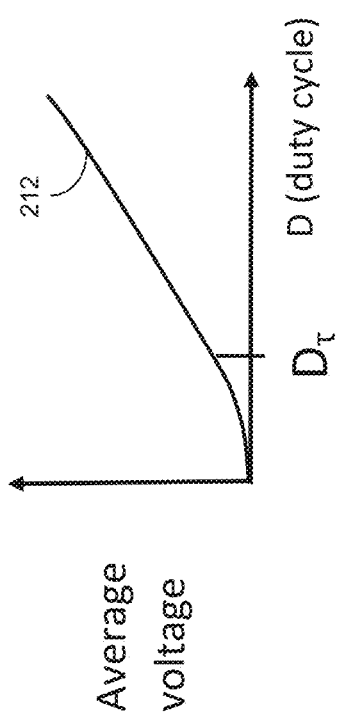

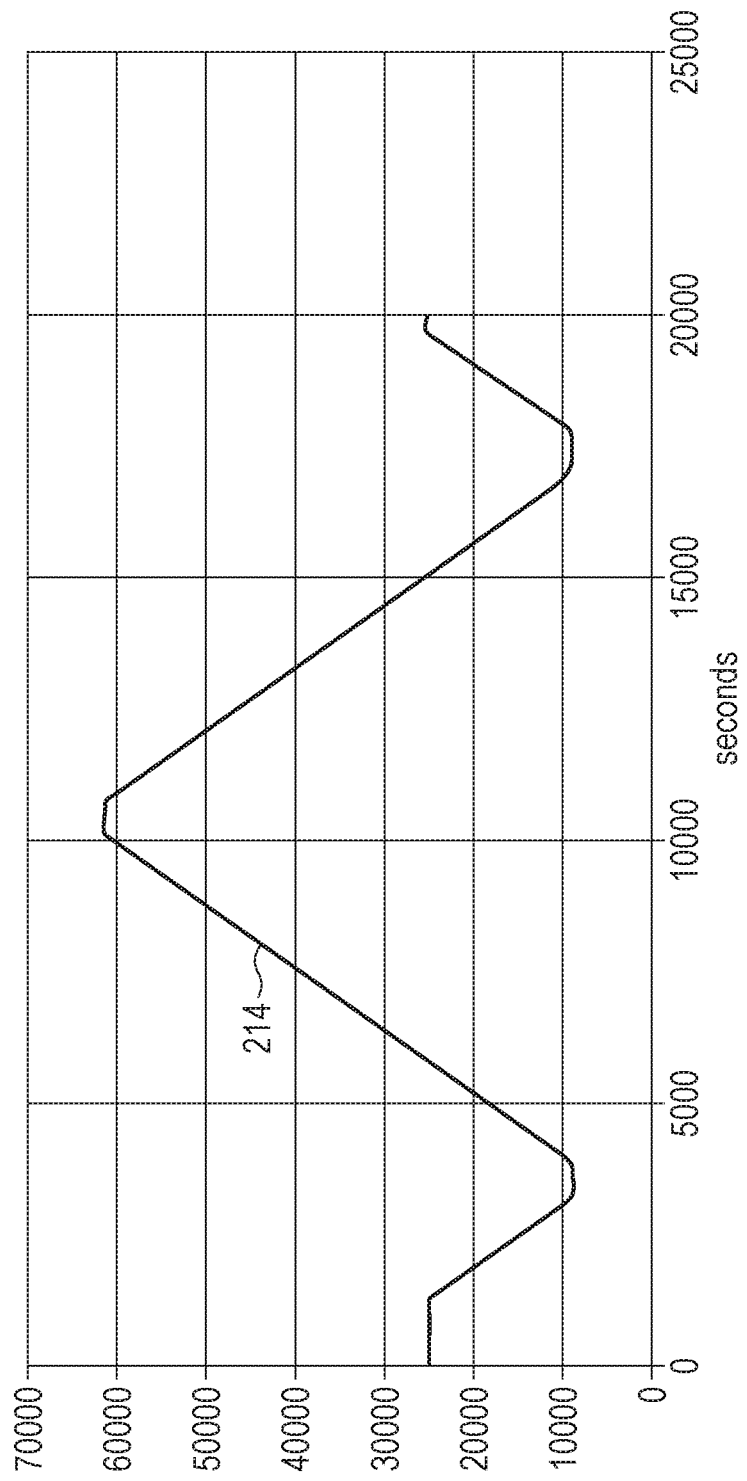

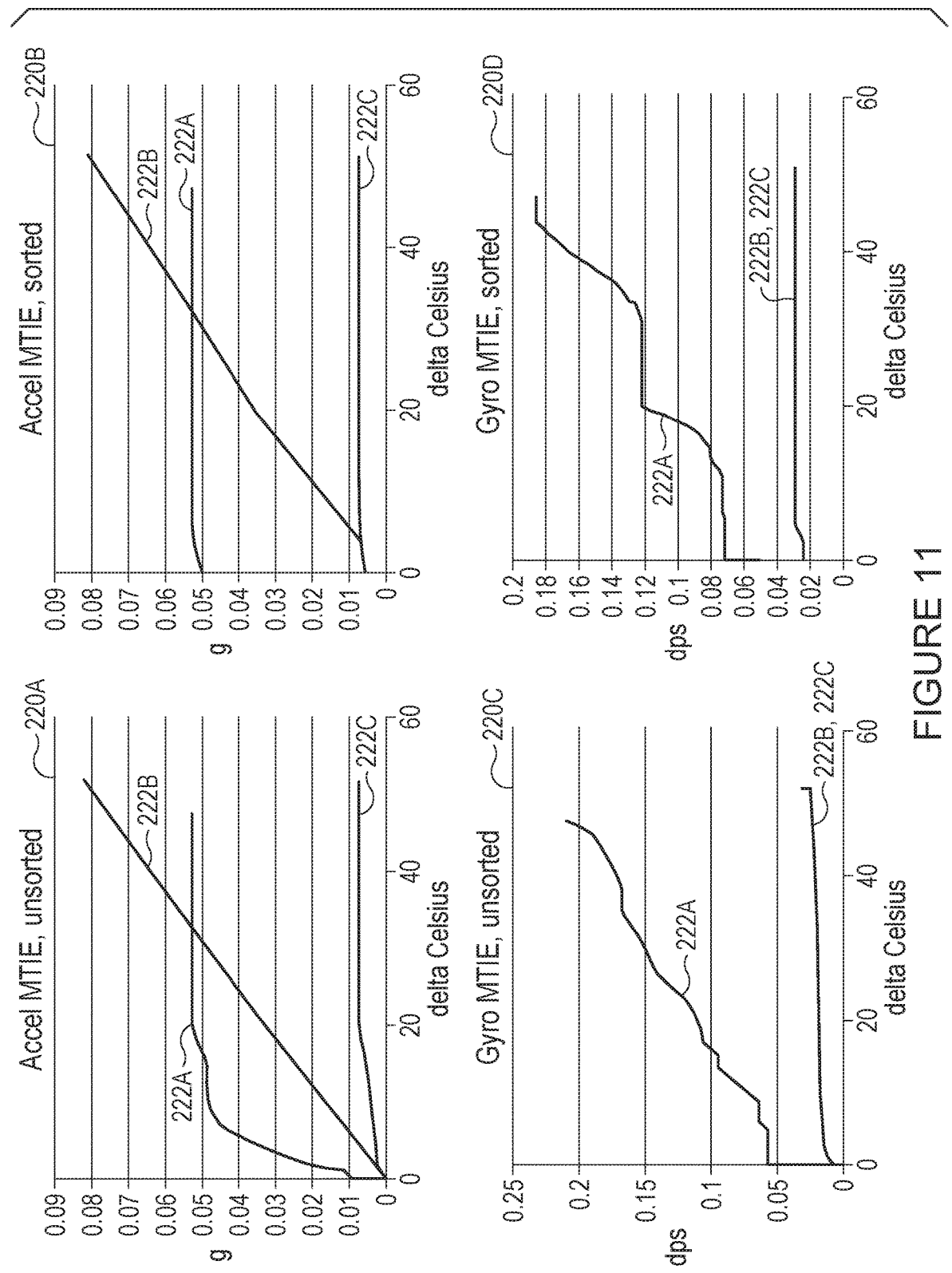

THERMAL STABILIZATION OF INERTIAL MEASUREMENT UNITS

The present application claims priority to U.S. Provisional Patent Application Ser. No. 62/297,712 filed on Feb. 19, 2016, entitled: METHOD AND DESIGN FOR THERMAL STABILIZATION OF INERTIAL MEASUREMENT UNITS which is herein incorporated by reference in its entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

TECHNICAL FIELD

One or more implementations relate generally to thermal stabilization of inertial measurement units.

BACKGROUND

Commercially-available inertial measurement units (IMUs) at the lower end of the price spectrum are prone to low-frequency measurement instability, in both offset (bias) and scale factor, due to variations in their thermal environments. This instability can be the dominant source of measurement errors, even with seemingly minor temperature changes.

Mitigation of this instability is typically attempted by one or more of the following techniques. In one example, each individual IMU is characterized in a thermal chamber, producing a lookup table used as a source of corrections in the field. Drawbacks to this technique include the tradeoff between characterization time and measurement accuracy; mismatches between optimum corrections for rising and falling temperature ramps of various slopes, due to effects of hysteresis, thermal delay, heat flux, and/or inertial/thermal sensor non-colocation within the IMU; interpolation error when operating at temperatures not adequately characterized, or modeled with insufficient accuracy; extrapolation error when operating at temperatures outside the characterized range; and the use of additional complex equipment within a thermal chamber to characterize scale factors of gyroscopes and accelerometers over temperature.

One could pay more for a higher-grade IMU, either an inherently superior part or one that has been pre-selected and/or pre-characterized extensively by the equipment manufacturer, the device manufacturer, or a third-party technology aggregator. A principal drawback of this method would be the high cost.

Another technique may incorporate measurement inputs for low-frequency error correction from additional sensors, such as magnetic, vision, lidar, ultrasonic, multi-antenna GNSS, or other sensor types, with higher weighting and/or higher bandwidth of utilization than feasible with more stable IMUs. A drawback to this technique is exposure to additional sources of error in an unstable or unpredictable environment, which must be evaluated and fused into an optimum attitude or position estimate. Such errors may not be conducive to simple resolution of ambiguities. In some cases, use of an insufficiently trustworthy sensor may lead to a degraded estimate.

Essentially all IMU manufacturers have come across this problem, just as all oscillator manufacturers have had to address thermal instabilities. As yet, none are known to have incorporated in-device thermal stabilization in any but the most expensive products (i.e. tactical or industrial grade devices). For the grade of device which is the subject of this invention (i.e. non-stabilized IMUs), the great majority of IMU users rely on one of the methods listed above to mitigate the problem.

BRIEF DESCRIPTION OF THE DRAWINGS

The included drawings are for illustrative purposes and serve to provide examples of possible structures and operations for the disclosed inventive systems, apparatus, methods and computer-readable storage media. These drawings in no way limit any changes in form and detail that may be made by one skilled in the art without departing from the spirit and scope of the disclosed implementations.

FIG. 9 shows the average voltage for different duty cycles.

FIG. 10 shows a temperature ramp applied to an IMU while operating within the thermal stabilization system, for the purpose of characterization and determination of calibration parameters.

FIG. 11 shows IMU results while operating within the thermal stabilization system.

DETAILED DESCRIPTION

Detailed aspects of the thermal stabilization system are disclosed herein, however, it is to be understood that the disclosed aspects are merely exemplary of the invention, which may be embodied in various forms. Therefore, specific structural and functional details disclosed herein are not to be interpreted as limiting, but merely as a basis for the claims and as a representative basis for teaching one skilled in the art how to variously employ the present invention in virtually any appropriately detailed structure.

Certain terminology will be used in the following description for convenience in reference only and will not be limiting. For example, up, down, front, back, right and left refer to the invention as orientated in the view being referred to. The words, "inwardly" and "outwardly" refer to directions toward and away from, respectively, the geometric center of the aspect being described and designated parts thereof. Forwardly and rearwardly are generally in reference to the direction of travel, if appropriate. Said terminology will include the words specifically mentioned, derivatives thereof and words of similar meaning.

A thermal stabilization system stabilizes inertial measurement unit (IMU) performance by reducing or slowing operating variations over time of the internal temperature. More specifically, a thermoelectric heating/cooling device operates according to the Peltier effect, and uses thermal insulation and a mechanical assembly to thermally and mechanically couple the IMU to the thermoelectric device. The thermal stabilization system may minimize stress on the IMU and use a control system to stabilize internal IMU temperatures by judiciously and bidirectionally powering the thermoelectric heating/cooling device. The thermal stabilization system also may use compensation algorithms to reduce or counter residual IMU output errors from a variety of causes such as thermal gradients and imperfect colocation of the IMU temperature sensor with inertial sensors.

One embodiment of the thermal stabilization system stabilizes IMUs with temperature-dependent errors of offset (bias) and/or scale factor which constitute, after settling to a particular value of temperature, substantially continuous, repeatable, history-independent, and non-hysteretic functions of temperature.

One embodiment of the thermal stabilization system stabilizes IMUs with temperature-gradient-dependent errors of offset (bias) which constitute, after settling to a particular value of temperature gradient, at a particular value of measured IMU temperature, substantially continuous, repeatable, history-independent, and non-hysteretic functions of temperature gradient.

Figure 1:
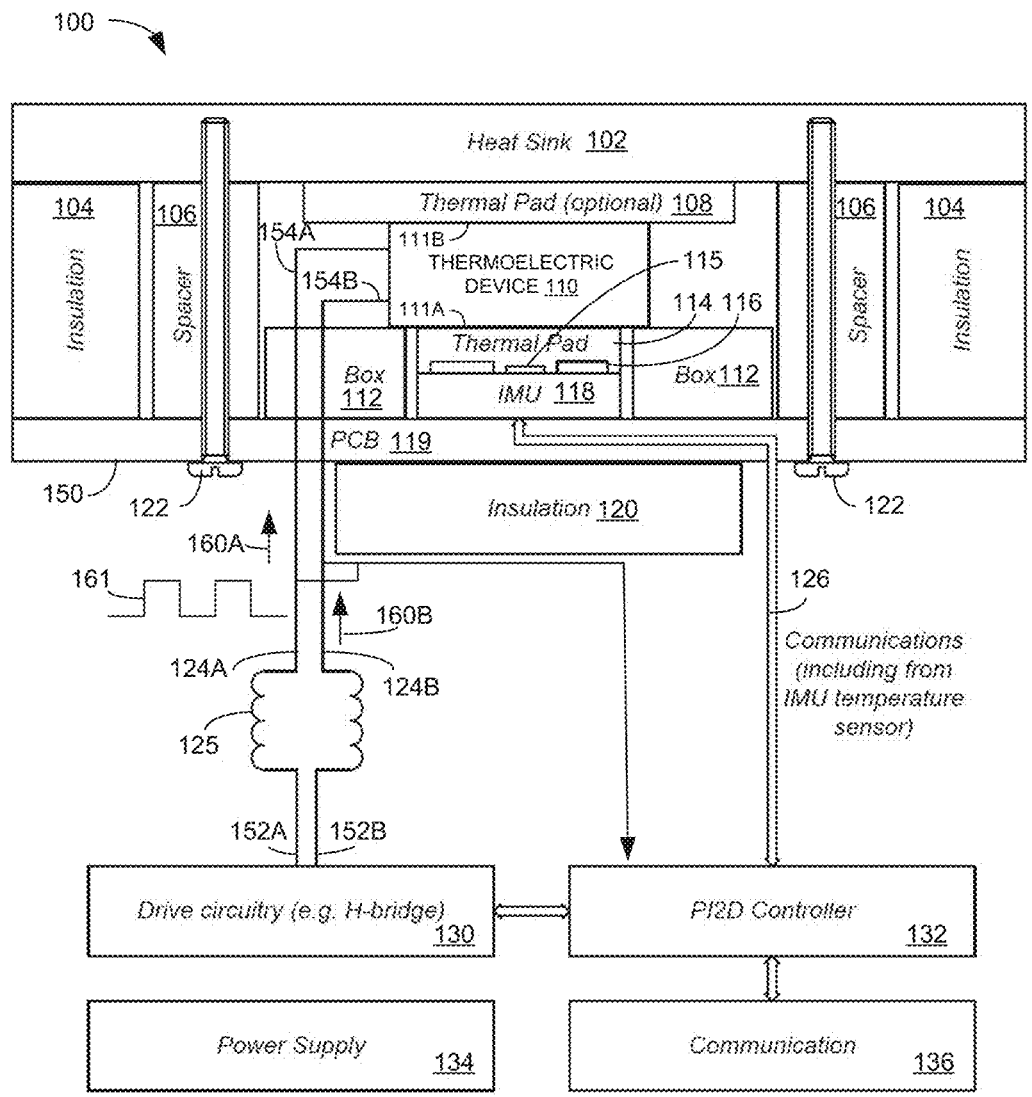
FIG. 1 is a cross-sectional block diagram through a midline of an IMU that includes a thermal stabilization system.
Figure 2:
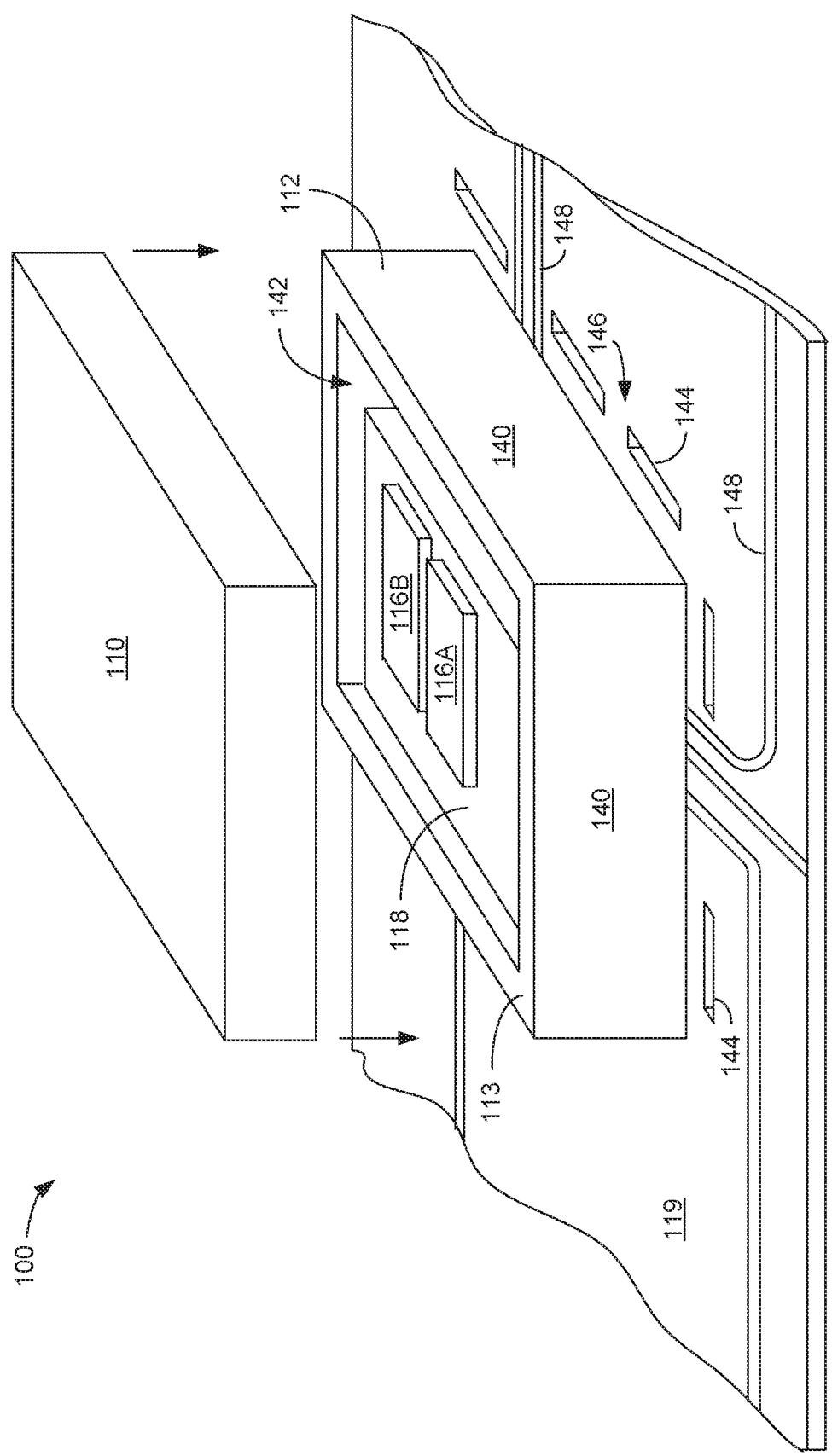
FIG. 2 is a perspective view of the box used in the thermal stabilization system.

FIG. 1 shows a thermal stabilization system 100 for an inertial measurement unit 118. FIG. 1 is a cutaway cross-sectional view through the midline of IMU 118. FIG. 2 shows a perspective view of a thermal box 112 used in stabilization system 100. Referring to FIGS. 1 and 2, IMU 118 may include any type and combination of inertial devices 116 for detecting the position, orientation, rate of rotation, acceleration, or any other kinematic state of a device or vehicle. Some types of IMUs 118 may alternatively be referred to as vertical reference units (VRUs) or digital measurement units (DMUs) and may also include inertial devices 116, such as, gyroscopes and accelerometers. In one example, thermal stabilization system 100 is used in combination with IMUs 118 located on farm vehicles and used for automatically steering or operating the farm vehicle and/or a farm implement towed by the farm vehicle.

Stabilization system 100 may include a thermoelectric heating/cooling device 110. In one example, device 110 operates based on the Peltier effect and is collocated with IMU 118 such that a nominally cool "active" side 111A of thermoelectric device 110 is closely and reliably coupled, both thermally and mechanically, to gyroscope and accelerometer devices 116 in IMU 118. In one example, thermoelectric device 110 is compressed against IMU 118 with an intervening thermal pad 114 of suitable compressibility to act as a thermal coupling device, gap filler, and if necessary, a mechanical stabilizer, while not inducing excessive mechanical stress on IMU 118.

A nominally hot side 111B of thermoelectric device 110 is possibly coupled through a thermally-conductive pad 108 to a heat sink 102. Heat sink 102 may be a mechanical enclosure of a product suitable for, clamping onto a device or vehicular for providing vehicle alignment, robustness, physical attractiveness, and/or heat transfer. In other embodiments, heat sink 102 may be a separate set of metal heat fins or any other type of material that transfers heat between an ambient environment and thermoelectric device 110.

IMU 118 may be mounted within a substantially rigid 5-sided box structure 112. The thermoelectric device 110 may be clamped onto a top side 113 of box 112 and form a 6th top side or cover for box 112. Compressive force of thermoelectric device 110 is applied primarily onto top side 113 of box 112 relieving stress on IMU 118 while maintaining suitable mechanical coupling and alignment between IMU 118 and heat sink 102.

One of the 5 sides of box 112 may include, but is not limited to, a printed circuit board (PCB) 119 to which either box 112, IMU 118, or both, may be mechanically and/or electrically connected. In one example, box 112 may include or comprise a socket that is electrically and mechanically attached to PCB 119 and permits easy removal/installation of IMU 118. Box 112 or socket 112 may be constructed of a combination of thermally insulating and thermally conductive materials. Box 112 may reduce heat transfer between IMU 118 and the ambient environment other than through thermoelectric device 110. Box 112 may increase uniformity of the thermal environment around IMU 118, thereby minimizing thermal gradients and consequent heat flux.

When used as one of the 5 sides of box 112, PCB 119 may include voids and/or copper planes that perform temperature and stress stabilization functions. For example, struts (not shown) may connect IMU 118 to the remainder of PCB 119 and reduce stress coupling through PCB 119 to IMU 118. IMU 118 may include a temperature sensor 115 that senses a temperature associated with gyroscope 116A, accelerometer 116B, or both. Alternatively, a temperature sensor, such as a thermistor, may attach externally to IMU 118 and measure the IMU temperature.

A pulse-width-modulator (PWM)-driven drive circuit 130 may drive thermoelectric device 110 and use a bidirectional, finely-adjustable direct-current (DC) 160 provided by a power supply 134. Drive circuit 130 may include output inductance 125 to reduce current ripple. Drive circuit 130 may monitor current 160 drawn by thermoelectric device 110. In one example, drive circuit 130 uses H-bridge circuitry to change current polarity on lines 124 driving thermoelectric device 110. A first positive current polarity 160A generated on line 124A by drive circuit 130 may cause device 110 to cool IMU 118 and a second negative current polarity 160B generated on line 124B by drive circuit 130 may cause device 110 to heat IMU 118. The duration or width of voltage pulses 161 on lines 124 determine the amount of cooling or heating device 110 provides to IMU 118.

A controller 132 may be connected to IMU 118 via a communications line 126 that sends a sensed temperature value from temperature sensor 115. Controller 132 may use the sensed IMU temperature value monitored on line 126 as an input for providing negative feedback to thermoelectric device drive circuit 130. In one example, controller 132 may be a double proportional integral derivative (PI2D) controller that provides long-term bias cancellation during linear temperature ramps.

All non-IMU circuitry on PCB 119 may be thermally isolated from IMU 118 to increase cooling efficiency of thermoelectric device 110. For example, ICs on PCB 119, drive circuit 130, controller 132, and any associated microprocessors, microcontrollers, or communication devices may be spaced apart and/or insulated from thermoelectric device 110 and IMU 118. For example, the non-IMU circuitry may be located on the outside of box 112. Any heat that requires removal from such circuitry can be coupled to the external environment heat sink by a path that does not involve IMU 118.

Voltage pulses 161 output on lines 124 do not instantaneously change from low to high and at low pulse widths start to resemble triangles reducing the efficiency of drive circuit 130 and the feedback control loop gain. The control loop gain may be compensated when the PWM duty cycle is less than a particular amount. For example, controller 132 may increase loop gain coefficients when generating the control signals for drive circuit 130.

Other factors may change the response of IMU 118 such as, mechanical stress on IMU 118, heat flux through IMU 118, non-colocation of temperature sensor 115 with the inertial devices 116, and/or inability of one temperature sensor 115 to adequately monitor temperature of a multiplicity of inertial devices 116. Compensation values may be added to different individual IMU output data streams such as, angular rate or acceleration associated with a particular axis to remove residual IMU output biases. These compensation values may be derived from low-pass-filtered, efficiency-compensated versions of the predicted or measured thermoelectric device current, which may itself be proportional to the most recently applied slew-rate-compensated or uncompensated PWM duty cycle value. Efficiency compensation may take into account the difference in heating vs. cooling efficiency of thermoelectric device 110.

Alternatively, controller 132 may compensate for residual IMU output biases by addition, to each individual IMU output data stream (angular rate or acceleration associated with a particular axis), compensation values that may be proportional to low-pass-filtered, efficiency-compensated, versions of the measured temperature difference between the IMU temperature sensor 115 and one or more additional temperature sensors located within the system. The additional temperature sensors may be positioned such that their measurements provide information on the thermal gradients within the system. The residual IMU output biases again may be caused by factors such as mechanical stress on the IMU, heat flux through the IMU, non-colocation of the temperature sensor with the inertial sensors, and/or inability of one temperature sensor to adequately monitor temperature of a multiplicity of inertial sensors.

In one example, a commercially-available IMU 118 is soldered to PCB 119 and may contain its own temperature sensor 115 which may be read externally by controller 132 via lines 126. Temperature sensor 115 may be mounted on a circuit board that forms part of IMU 118 that also retains gyroscope 116A and accelerometer 116B. Temperature sensor 115 also may be located internally within gyroscope 116A and/or accelerometer 116B. Some thermal stabilization systems 100 may use other types of IMUs 118 with different configurations for attaching to a vehicle and may use other types of temperature sensors 115 for monitoring the IMU temperature.

As mentioned above, box 112 may comprise an IC socket. For example, some IMUs 118 are provided in a PLCC-28 type package which may be inserted in a compatible socket. Alternatively, IMU 118 may be soldered to PCB 119, with a surrounding 4-sided box 112 that fits snugly around it, of a material with good properties of thermal insulation and mechanical strength. In this configuration, PCB 119 may form the 5th bottom side of box 112, and the height of remaining 4 sides 140 are sufficient to ensure IMU 118 is recessed within cavity 142 formed by box 112. The region above PCB 119 within cavity 142 formed by 5-sided box 112 may be filled with insulating material such as urethane. Additional components such as connectors, bypass capacitors, etc. may be separated from IMU 118 and attached on PCB 119 outside of box 112.

A series of slots 144 may be formed in PCB 119 and extend immediately adjacent, externally, and peripherally around the outside of IMU 118 and 5-sided box 112. Slots 144 reduce lateral heat transfer through PCB 119 while retaining sufficient channels 146 for printed interconnects 148 used by electronic IC devices while also maintaining mechanical integrity of PCB 119. To reduce transfer of stress through PCB 119 to IMU 118, the number of routing channels 146 and number of intervening slots 144 may each be around 3, however any number and sizes of slots 144 may be used.

A bottom side 150 of PCB 119 immediately below IMU 118 may be kept as free as possible of IC components, to reduce thermal transfer. An insulating foam 120 or some other type of insulating material may be placed on bottom side 150 of PCB 119. To further reduce thermal transfer, connectors and bypass capacitors (not shown) may be placed reasonably far from IMU 118 on bottom side 150 of PCB 119.

As described above, one type of thermoelectric device 110 may include a Peltier module capable of transferring heat generated by IMU 118 when in a cooling mode. Device 110 also may overcome environmental heat flux to/from IMU 118 across a determined ambient temperature range. The cold/active side 111A of thermoelectric device 110 may form the 6th top side or cover for box 112 so box sides 140, PCB 119, and device 110 completely surround IMU 118. Example thermoelectric devices 110 may include the Model No. CUI CP60140 sold by CUI Inc., Tualatin, Or 97062 and the Model No. HT9.3.F2.2525.TB.RT.W6 sold by Laird PLC; Earth City, Mo. 63045.

IMU thermal pad 114 may be custom-cut for a moderately-snug fit that occupies space 142 between IMU 118 and thermoelectric device 110. Mechanical compression of thermal pad 114 may be sufficient to prevent excessive mechanical stress on IMU 118 while ensuring that space 142 remains filled and heat transfer is adequate. One example material used for thermal pad 114 may include Model No. Softflex-B016 made by Aavid Thermalloy LLC; Laconia, N.H. 03246. The hot side heat sink 102 may include a thermal pad 108, thermal compound, and/or fine surface finish to increase efficiency of heat transfer to thermoelectric device 110.

PCB 119, box 112, thermoelectric device 110 (with any associated "hot side" thermal pad 108 if provided), and hot side heat sink 102 may be compressed together for good thermal and mechanical performance. One technique to achieve this compression is to mount standoffs/spacers 106 around box 112 which press against PCB 119 on bottom end and press against heat sink 102 on top ends. Compression devices 122 such as screws, studs, etc. are inserted into holes formed in PCB 119, spacers 106 and heat sink 102. Compression devices 122 screw into threaded holes formed in heat sink 102 pulling heat sink 102, thermal pad 108, and thermoelectric device 110 against top surface 113 of box 112 and compressing thermal pad 114 against IMU 118.

In another example, threaded or unthreaded screw holes may be formed in box 112. Compression devices 122 are then inserted up through aligned holes formed in PCB 119 and box 112, and threadingly engage with aligned threaded holes formed in heat sink 102. Compression devices 122 are further screwed into the threaded holes formed in heat sink 102 pulling heat sink 102, thermal pad 108, and thermoelectric device 110 against top surface 113 of box 112 and compressing thermal pad 114.

In either example, compression devices 122 may be located in reasonable proximity to IMU 118 to avoid creating undue stress on IMU 118 and avoid warping PCB 119. Compression devices 122 when in contact with heat sink 102 may create a potential thermal path that may reduce the efficiency of thermoelectric device 110. Compression devices 122 are selected, designed, and located to maintain the efficiency of device 110. For example, low non-thermal conducting plastic screws 122 may be used or screws may be located far enough from box 112 to reduce heat transfer to IMU 118. In one example, compression of thermoelectric device 110 against IMU 118 is limited by the dimensions of box 112, avoiding full compressive force from thermoelectric device 110 against IMU 118 or thermal pad 114.

Thermal pad 108 may occupy the space between thermoelectric device 110 and heat sink 102 to avoid tolerance stackup issues. Heat sink 102, insulation 104 formed around the outside of box 112, and PCB 119 could all extend laterally, without materially affecting the nature of this embodiment. Similarly, heat sink 102 as shown could form one side of an enclosure which surrounds the other elements, in whole or in part. Trace routing, voids, circuit paths, and connectors are not shown in FIGS. 1 and 2 for clarity.

As mentioned above, thermoelectric device drive circuit 130 may consist of an H-bridge, with two outputs 152A and 152B each electrically connected to a different terminal 154A and 154B, respectively, of thermoelectric device 110. Inductors 125 may be placed in series in one or both of connections 124 between terminals 154 and outputs 152. An example H-bridge circuit 130 may include Model No. DMHC3025LSD made by Diodes Incorporated; Plano, Tex. 75024. Example series inductors 125 may include Model No. HC9-470-R made by Eaton Bussmann; Cleveland, Ohio 44122. Drive circuit 130 may operate at a pulse width modulated (PWM) frequency of about 200 kHz, and may draw 5V DC power from power supply 134. In one example, inductors 125 are located relatively far from IMU 118 to reduce the concentration of magnetic fields from any magnetic sensors operating in IMU 118.

PI2D controller 132 may be any microcontroller capable of controlling H-bridge drive circuit 130 in one example at a rate of 200 kHz with a duty-cycle resolution of around 1% or less. Controller 132 may have a floating-point capability for improved loop dynamics and limit checking and use a 32-bit operation for increased calculation precision. Controller 132 may receive sensor data from IMU 118 in real-time over communications lines 126, including temperature values from temperature sensor 115 whether incorporated into IMU 118 or not. Controller 132 also may receive a continuous signed measurement of drive current 160 supplied to thermoelectric device 110 from a current measurement device (not shown).

Communication device 136 may include any interface for communicating with controller 132, such as a universal serial bus (USB) interface, local area network (LAN) interface, controller area network (CAN) bus interface, a wireless (WiFi) interface, or any other communication network or bus interface. In one example, drive circuit 130, controller 132, power supply 134 and communication device 136 are thermally isolated from IMU 118 and provided with thermal dissipation paths that avoid IMU 118.

Thermoelectric device 110 is appropriately sized to transfer heat generated by IMU 118 and H-bridge drive circuit 130 is appropriately sized to provide bidirectional current with good efficiency. For example, the CUI CP60140 Peltier module described above operates at up to 6.0 amps (A), with greatest efficiency in the lower half of its operating range of (0-3 A). The Peltier module has a resistance of about $0.3\Omega$, so a voltage of up to about 1V may be used, plus additional voltage for the resistance of drive circuit 130.

Many H-bridges are composed of MOSFETs and require a particular minimum supply voltage to operate with good efficiency. In one example, H-bridge 130 may be powered by a 5 volt (V) operating supply voltage from power supply 134, allowing for a linear 3.3V sub-regulator for clean voltage supply to IMU 118 and/or PI2D controller 132.

To reduce current ripple that may degrade Peltier efficiency in device 110 and to allow for the use of small inductors, drive circuit 130 may be operated at as high a PWM frequency as can be achieved without excessive efficiency degradation from switching losses. Too-high a PWM frequency may increase the effective "dead-time" in the transfer function of duty cycle to current, requiring more aggressive gain compensation and raising the likelihood of degraded stability or loop bandwidth. A preferred frequency may depend on specific component choices and may be a tradeoff between factors such as component size and cost, current ripple, switching losses, dead-time, emissions, and duty cycle resolution.

The greatest stress on thermoelectric device 110 may occur at maximum cooling when operating at maximum ambient temperature. A preferred operating point (i.e. temperature set point) for IMU 118 may be set high enough to keep the temperature on hot side 111B of thermoelectric device 110 below an absolute maximum during all expected operating conditions. For example, the Laird ThermaTEC series of thermoelectric devices can operate up to 150 C.

An open-loop time/frequency response of temperature stabilization system 100 may be either simulated or measured. Coefficients are then accordingly selected for PI2D controller 132 and the consequent loop dynamics. The processes for performing control loop analysis are known to those skilled in the art and are therefore not described in further detail.

Rise and fall times are measured for the output voltage of H-bridge drive circuit 130. The gain coefficients used in the proportional, integral, double-integral, and derivative PI2D controller 132 may be automatically varied to compensate for the effective gain reduction that occurs when the PWM duty cycle falls below the sum of the rise and fall times. For example, the PWM waveform output on lines 124 in FIG. 1 may resemble a triangular shape when the duty cycle falls below the sum of the rise and fall times. During these short duty cycles, the gain coefficients used in controller 132 may be multiplied by a correction factor inversely proportional to the most recent duty cycle. This particular gain correction might only be necessary if PWM is used to control the drive current 160, as opposed to a linear drive method.

The gain correction factor may be designed to be continuous at value 1.0 as duty cycle traverses the boundary defined as duty cycle equal to sum of rise time and fall time. Gradual changes in gain correction factor may be applied when the duty cycle drops below the sum of the rise and fall times to prevent sudden steps in the drive current. Also, the gain correction factor may be constrained by an upper limit with a value higher than 1.0. One gain correction factor limit value that shows good results is 10.0. This gain correction limit value is a tradeoff between different sources of instability (too-slow or too-fast response).

Thermal stabilization system 100 improves performance of non-stabilized IMU 118 using the structure described above. For additional improvement, thermal stabilization system 100 may operate over the intended operating temperature range, while the internal IMU temperature is stabilized using the compensation processes described above. In one example, controller 132 ramps drive current 160 across the full operating range of ambient temperatures in both current directions for both heating and cooling.

The following steps use characterization data for IMU 118 in conjunction with varying drive current 160. Drive current 160 may be monitored directly or substituted with the applied and signed PWM duty cycle value. Heating and cooling are assigned opposite signs, whether of drive current or duty cycle, and drive current value 160 is preferably compensated for slew-rate-induced offsets.

For each IMU sensor device 116, and for each physical axis monitored by that sensor device 116, a linear regression is performed (i.e. least-squares curvefit) on the uncompensated (i.e. raw) sensor/axis characterization data from the temperature-stabilized IMU 118. A modification is used for either the actual Peltier drive current 160, the slew-rate-compensated PWM duty cycle value, or the raw PWM duty cycle value. The modification may incorporate both low-pass-filtering and scale factor compensation to account for the lower efficiency of Peltier device 110 when cooling compared to heating.

Figure 3:
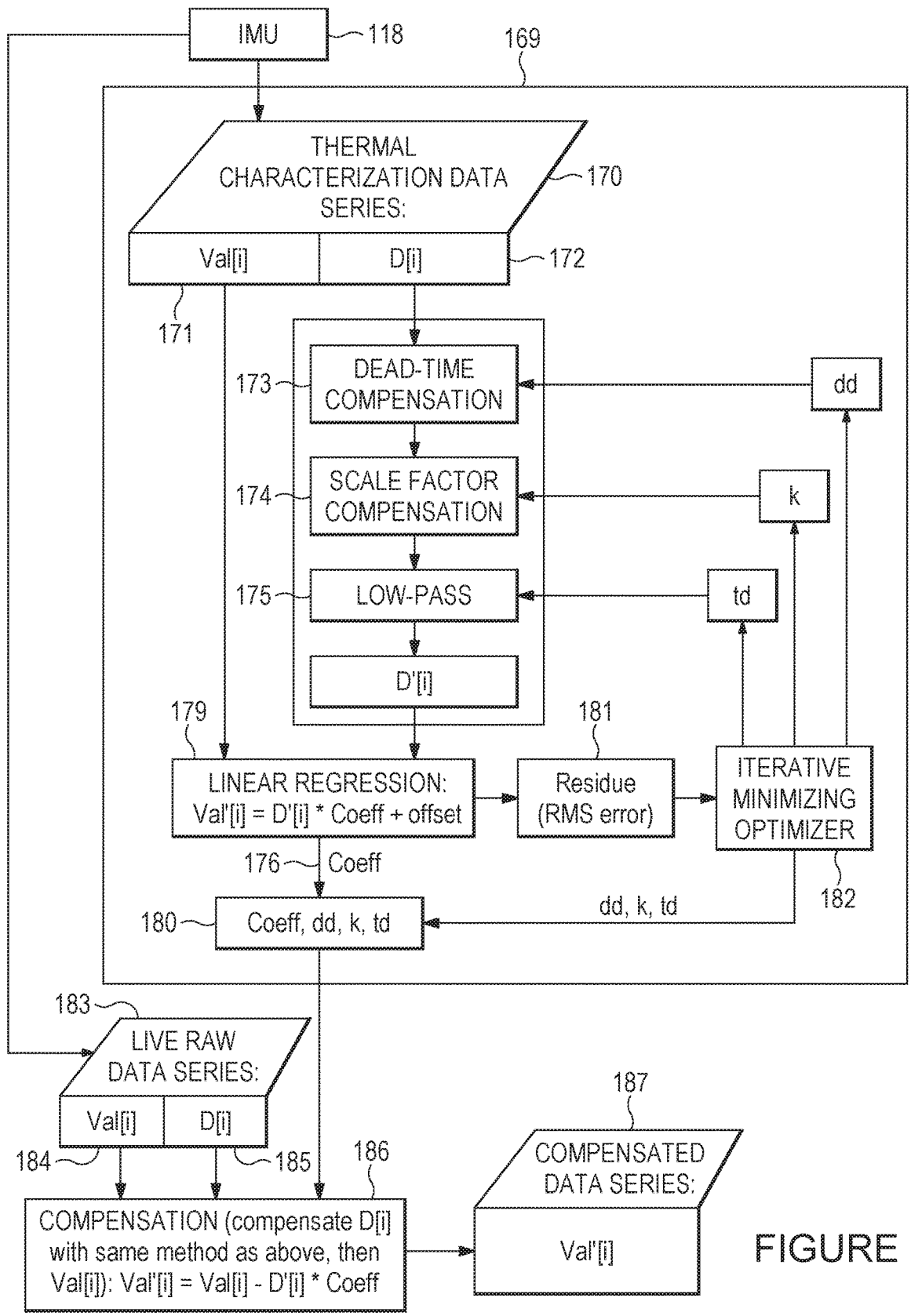
FIG. 3 is a logical process for providing thermal stabilization of IMUs.

FIG. 3 is a flow chart showing the process for characterizing and calibrating each IMU 118 over an external ambient temperature range. In this embodiment of the flow chart, thermoelectric drive strength is implicitly estimated from the known PWM duty cycle D[i]. As part of each linear regression 179, a low-pass filter time constant td, scale factor compensation value k, and dead-time estimate dd are varied to optimize the curvefit. For each sensor/axis combination, a sensitivity term Coeff (which generally may be response divided by current, or response divided by PWM duty cycle, depending on which measure of thermoelectric device drive strength is used; in this embodiment it is response divided by PWM duty cycle) is stored in non-volatile memory within either controller 132 or external memory in the system 100. The low-pass filter time constant value td, scale factor compensation value k, and dead-time estimate dd for each optimum curvefit are also stored. The offset terms for the linear regressions may be discarded if system 100 contains other means of adapting to a constant bias in the IMU sensor data. Otherwise, the offset terms are stored in the non-volatile memory.

In actual operation of stabilization system 100, a continuous additive correction is applied to each sensor/axis data stream. For example, the corresponding arithmetic product of the stored sensitivity term Coeff as described above and the corresponding low-pass-filtered, efficiency-compensated version of either the Peltier drive current, or the slew-rate-compensated PWM duty cycle value, or the raw PWM duty cycle value, depending on which measure of thermoelectric device drive strength is used, is subtracted from each data stream (Val'[i]=Val[i]−D'[i]*Coeff).

Ideally characterization of IMU 118 corresponds to an intended temperature operating range. As mentioned earlier, a bidirectional temperature ramp may provide an overall correction for actual use cases as ambient temperature rises or falls. But a ramp composed entirely of heating or cooling still may provide some value. In one example, the IMU 118 is actively stabilized during calibration to a fixed temperature set point.

FIG. 3 also shows how the obtained calibration coefficients are applied to convert raw IMU data from a temperature stabilized IMU 118 into compensated data. In one example, a linear regression is used. In another example, a polynomial regression also may be used but may use additional coefficients, depending on the number of terms.

Thermal characterizations 169 are performed for different inertial devices 116 in IMU 118. Parameters 180 are generated for each of the inertial devices 116 in IMU 118 and then used on live raw data series 183 output from IMU 118 during normal operation to generate compensated data series 187. Thermal characterization data series 170 is data output from IMU 118 during characterization operations 169. Val[i] is a general description of any one of the data series output by IMU 118 representing an inertial measurement. For example, Val[i] could represent the angular rate around the x, y, or z-axis or could represent the acceleration in the x, y, or z directions. Each of these individual data series 170 are characterized and compensated and Val[i] may be the ith sample of raw IMU output for any of rateX, rateY, rateZ, accelX, accelY, accelZ.

D[i] represents either the measured or predicted duty cycle that controller 132 causes H-bridge drive circuit 130 to generate for driving thermoelectric device 110. For example, D[i] may be the ith sample of uncompensated PWM duty cycle (−1.0<D<1.0). It is assumed that D[i] is either generated directly in synchronization with Val[i], or derived by re-sampling, interpolation, or some other means, either in real time or as part of post-processing. Such methods are known in the art and are therefore not described here.

The pressure applied to IMU 118 by thermal stabilization system 100 may generate a bias on the output data series Val[i]. As mentioned above, the outputs from accelerometer 116B may have more bias from the applied pressure than the outputs from gyroscope 116A. The amount of bias may be proportional to the duty cycle D used for driving thermoelectric device 110. Coeff 176 represents a constant of proportionality that relates the bias imposed by thermal stabilization system 100 on the duty cycle D[i] applied to thermoelectric device 110. The offset in linear regression 179 is a constant term that removes any initial data value reading from inertial device 116 when there is no movement.

Dead-time compensation value dd and scale factor compensation value k are calculated for different inertial devices 116 in IMU 118 by ramping the temperature up and down. Guesses are then initially made for dead-time compensation value dd in operation 173, the scale factor compensation value k in operation 174, and the low pass filter time delay td in operation 175.

Linear regression 179 generates both a constant of proportionality Coeff 176, and a root mean squared (RMS) residue 181, from the data series output Val[i] and the compensated duty cycle D[i]. Residue 181 represents the RMS value of the difference between the measured data output Val[i] and the linear regression output Val'[i] calculated based on predicted dead-time compensation 173, scale factor compensation 174, and low-pass filter 175.

An iterative minimizing optimizer 182 calculates a new deadtime compensation value dd, scale factor compensation value k, and time delay td. The same data series 170 as before is compared with the new output of linear regression 179, producing new parameters 180, and the resulting residue 181 is fed back into optimizer 182. This iterative process is repeated until a lowest residue 181 is generated. Parameters 180 (Coeff, dd, k, and td) generating the lowest residue 181 represent the characterization of IMU 118 and are used in compensation 186 to adjust the output of IMU 118 during normal operation.

IMU 118 generates live raw data series 183 during normal operation while used in combination with thermal stabilization system 100. For example, IMU 118 may be used as part of an automatic steering system that steers a farm vehicle along a path on a field. Of course this is just one example, and thermal stabilization system 100 may be used with any type of IMU 118 for any application. IMU 118 may generate different accelerometer or gyroscope data 184 (Val[i]) based on duty cycle 185 D[i] generated by drive circuit 130. Duty cycle 185 (D[i]) is generated by drive circuit 130 based on control signals generated by controller 132. Compensation 186 is performed either by controller 132 or some other processing device.

Parameters 180 (Coeff, dd, k, and td) may be stored in memory within controller 132 and associated with a specific IMU 118. Parameters 180 are then used to compensate the raw data Val[i] based on the duty cycle D[i] used for operating thermoelectric device 110. For example, controller 132 may in compensation 186 compensate the actual duty cycle D[i] that was applied to thermoelectric device 110, and then multiply the compensated duty cycle D'[i] by Coeff 176 and subtract the product of said multiplication from IMU 118 outputs Val[i] to generate a compensated data series 187 where compensated IMU 118 outputs Val'[i]=Val[i]−(D'[i] *Coeff). Val'[i] may be the ith sample of compensated IMU output either during characterization, or from live data. D'[i] may be the ith sample of compensated PWM duty cycle either during characterization or from live data.

Figure 4:
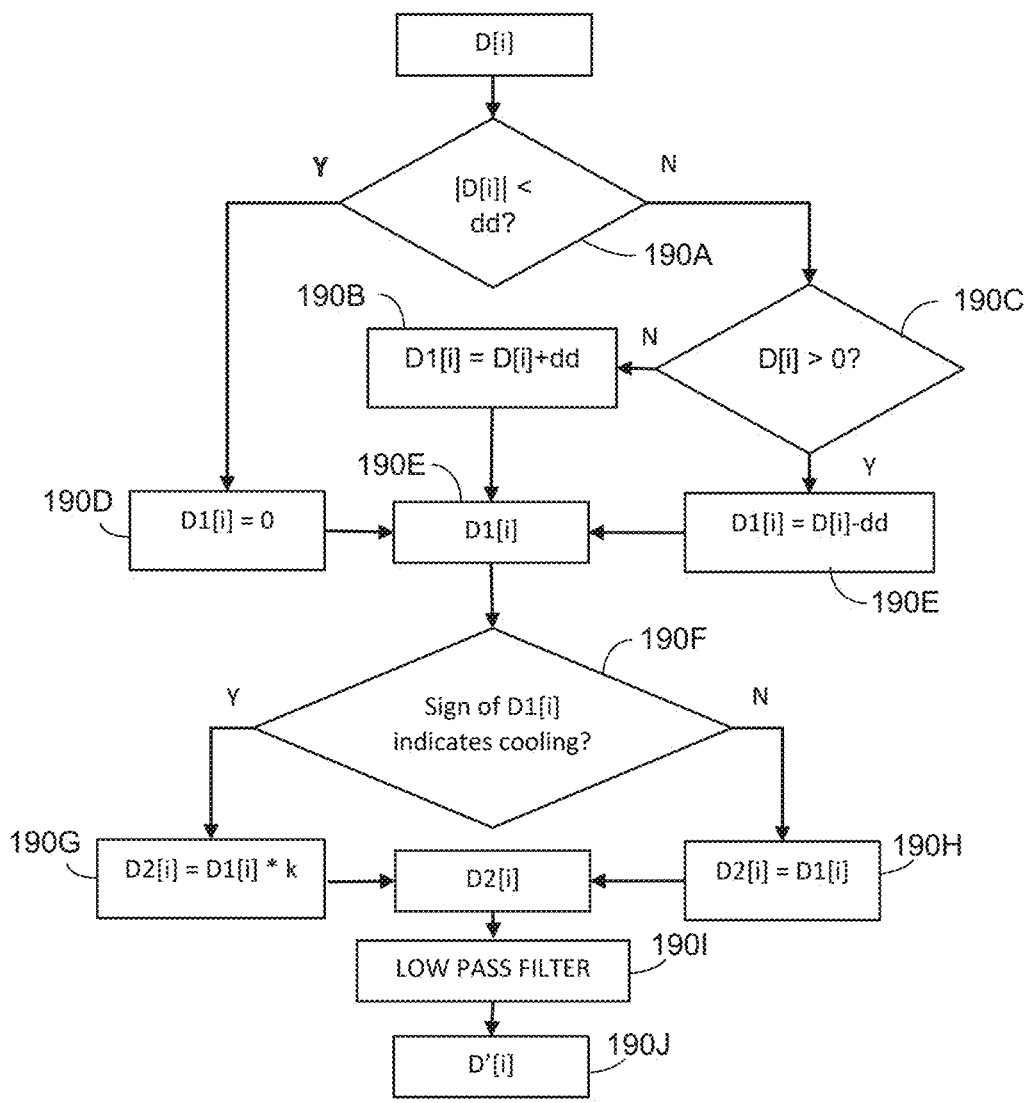
FIG. 4 shows an example duty cycle compensation process used by the thermal stabilization system.

FIG. 4 shows one example process for duty cycle compensation. The uncompensated duty cycle is received and operation 190A determines if the absolute value of the duty cycle is less than the dead-time dd value. If yes, operation 190D sets a dead-time compensated duty cycle D1[i] to zero. If the absolute value of the duty cycle D[i] is greater than dd, operation 190C determines if D[i] is positive. If D[i] is positive, operation 190E subtracts dd from D[i] to produce D1[i]. If D[i] is negative, operation 190B adds dd to D[i] to produce D1[i].

Operation 190F determines if the duty cycle indicates heating or cooling based on the sign of dead-band compensated duty cycle value D1[i]. If cooling, operation 190G multiplies the dead-band compensated duty cycle value by the scale factor k to generate scale factor compensated duty cycle value D2[i]. If the duty cycle indicates heating, operation 190H sets the scale factor compensated duty cycle D2[i] to the dead-band compensated duty cycle value D1[i]. Operation 190I applies a low pass filter to the duty cycle value D2[i] to generate the final compensated duty cycle D'[i] in operation 190J

To explain in more detail, controller 132 attempts to stabilize the temperature of IMU 118. Controller may use parameters 180 (the scale factor compensation value k, dead-time compensation value dd, time delay td, and Coeff) in compensating raw IMU data Val[i].

Duty cycle D again refers to a PWM duty cycle. Opposite signs refer to heating and cooling. The term dd again refers to an assumed dead-time as a fraction of a time period. Dead-time compensation D is calculated according to the following (using Octave script syntax):

$$D=D.-\text{sign}(D).*((\text{abs}(D)>dd).*dd+(\text{abs}(D)<=dd).*\text{abs}(D))$$

With polarity taken into account, the lesser of D itself and the presumed dead-time dd are subtracted from D. Only changes in PWM duty cycle outside duty cycle dead-band, −dd<D<dd are counted.

Figure 5:
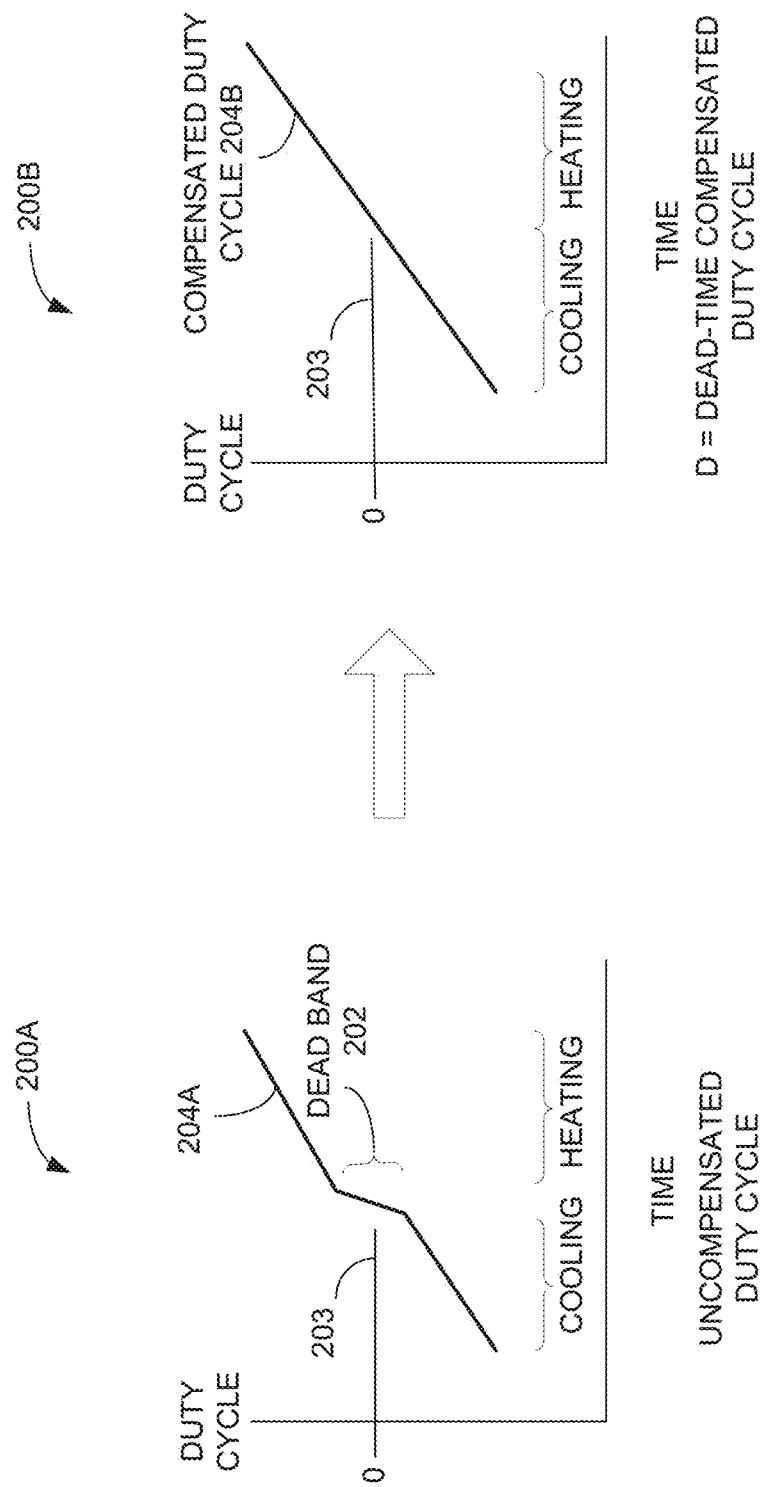
FIG. 5 shows how duty cycle is compensated for deadtime such as may be caused by non-zero rise and fall times of a pulse width modulated current driver.

FIG. 5 shows one example of a dead-band compensated duty cycle. Graphs 200A and 200B include horizontal x axes representing time and vertical axes representing duty cycle D. Graph 200A shows a dead-band 202 created when thermoelectric device 110 transitions between heating and cooling operations.

For example, controller 132 may continuously shorten the duty cycle D of the drive current used for operating thermoelectric device 110 as the measured temperature around IMU 118 starts nearing heating/cooling transition 203. The actual set point may be above or below the heating/cooling transition depending on ambient temperature and heat flux.

The current gain quickly decreases as the duty cycle narrows below the sum of the duty cycle rise and fall times. Controller 132 may rapidly increase the duty cycle during dead-band 202 to rapidly traverse dead-band 200 and compensate for the reduced duty-cycle-to-current gain in this region of duty cycle.

Linear regression may not expect the non-linear change in duty cycle during dead-band 202, and may produce an inferior set of optimized parameters 180 if this sudden non-linear change is not removed. Controller 132 may compensate duty cycle D to remove the effects of dead-band 202. For example, controller 132 may add a dead-time compensation value dd to the duty cycle value during a first cooling portion of duty cycle curve 204A and subtract the dead-time compensation value dd from a second heating portion of duty cycle curve 204A to create a compensated linear duty cycle curve 204B as shown in graph 200B. Note that the actual PWM duty cycle is unchanged by this particular compensation, it is only the value used as an input to linear regression that is changed.

Scale factor compensation value k refers to Peltier cooling efficiency/Peltier heating efficiency, where 0<k<1. Efficiency may refer to the amount of power or watts used for driving thermoelectric device 110 when heating or cooling. For example, device 110 may use more power and be less efficient cooling compared with heating, for the same temperature difference between opposite sides of device 110.

The following equation shows the application of k to the PWM duty cycle D to compensate for efficiency differences between heating and cooling. In this example, positive D is assumed to correspond to cooling. If positive, D is scaled by the presumed relative cooling/heating efficiency k. Heating may be more efficient so D may change slower. Using Octave script syntax, we can compensate D for this effect:

$$D=D.*((D>0).*k+(D<0))$$

(If D is positive, here assumed to correspond to cooling, scale D by presumed relative cooling/heating efficiency 'k')

Figure 6:
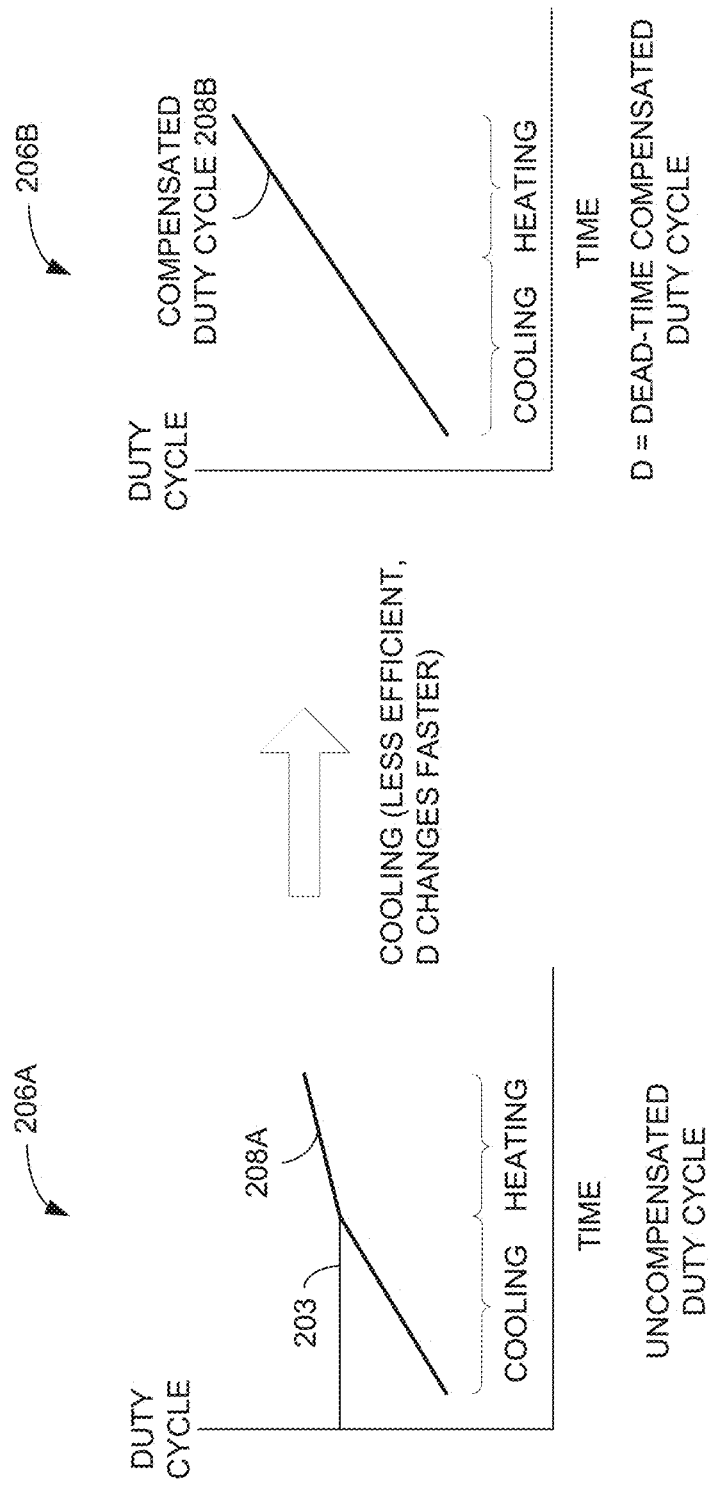
FIG. 6 shows how a scale factor coefficient is used for compensating a dead-time compensated duty cycle for the relative inefficiency of thermoelectric heating/cooling devices when cooling versus heating.

FIG. 6 includes a graph 206A showing the effects of less efficient cooling by thermoelectric device 110. For example, inherent heat created by the drive current may increase heating efficiency of thermoelectric device 110 and thereby use less drive current. The current heating effects may reduce cooling efficiency and cause controller 132 to increase the PWM duty cycle at a faster rate when cooling is underway than when heating is underway, for the same temperature difference between the hot and cold sides of device 110.

Linear regression may not expect the change in slope of duty cycle when transitioning between heating and cooling, and may produce an inferior set of optimized parameters 180 if this change in slope is not removed. Scale factor compensation accounts for different efficiencies for cooling versus heating by multiplying the portion of duty cycle curve 208A associated with heating by a scale factor compensation value k to generate a linear duty cycle response as shown by duty cycle curve 208B in graph 206B. Alternatively, the portion of curve 208A associated with cooling is multiplied by a scale factor compensation value k, or both cooling and heating portions of curve 208A are multiplied by different scale factor compensation values k to provide a linearly compensated duty cycle curve 208B. Note that the actual PWM duty cycle is unchanged by this particular compensation, it is only the value used as an input to linear regression that is changed.

Low pass filter 175 reduces noise in the compensated data series 187 that might otherwise be added by calibration calculations. Low-pass filter single pole time constant in seconds is referred to as td. An example of application of a single-pole low-pass filter with time constant td to the duty cycle D is shown below (using Octave syntax):

[D,sf]=filter([1/(1+alpha),0],[1,1/(1+alpha)−1], D,D(1)*alpha/(1+alpha)), where, alpha=fs*td, and fs is the cut-off frequency.

Iterative minimizing optimizer 182 in FIG. 3 attempts to optimize a particular system output, defined to be optimum when residue 181 is minimized. Optimizer 182 iteratively searches through combinations of system parameters 180 in a manner presumed to converge at a reasonably optimum result. One example, optimizer is fminsearch provided in Octave.

Figure 7:
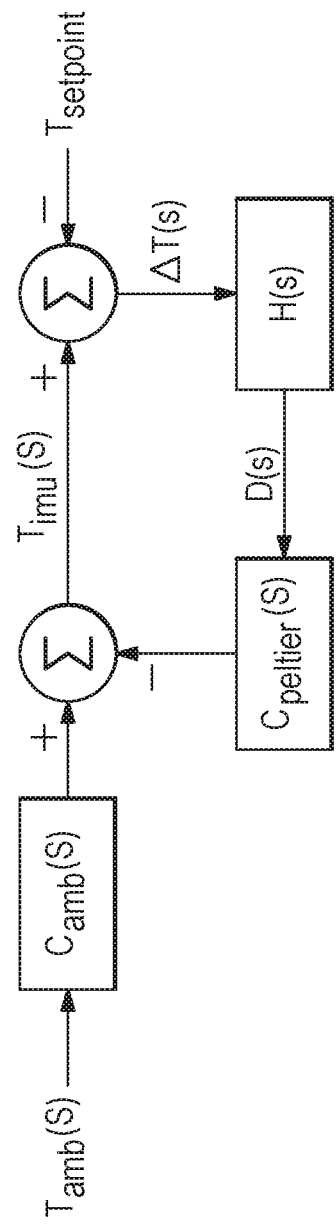
FIG. 7 shows a feedback control system used by the thermal stabilization system.

FIG. 7 shows an example feedback control system implemented in controller 132 (FIG. 1) shown in the form of Laplace transforms. $T_{imu}$ (the IMU temperature) is monitored and compared to $T_{setpoint}$ (the desired temperature setpoint). The difference ($\Delta T$) is multiplied by gain H in the feedback path, producing H-bridge duty cycle D. This duty cycle controls the current applied to thermoelectric device 110, with polarity such that as $T_{imu}$ increases above $T_{setpoint}$, thermoelectric device 110 is made to apply cooling to IMU 118. The effect of D on IMU temperature is represented by $C_{peltier}$, with the required negative feedback indicated by the negative sign at the summation node. Meanwhile, $T_{amb}$ (the ambient temperature) also affects $T_{imu}$, through function $C_{amb}$ which is ideally weaker and slower-acting than $C_{peltier}$.

The equation relating $T_{imu}$ to $T_{amb}$ and $T_{setpoint}$ may be derived:

$$T_{imu}(s) = \frac{T_{amb}(s) \cdot C_{amb}(s) + T_{setpoint} \cdot C_{peltier}(s) \cdot H(s)}{1 + C_{peltier} \cdot H(s)}$$

This equation is sufficient to predict the long-term effect of a linear ramp of ambient temperature on $T_{imu}$. For long-term effects (t goes to infinity), the effect on the Laplace transform is for frequency (s) to go to zero. Therefore the above equation is evaluated in the limit as s approaches zero.

Assuming that $C_{amb}$ and $C_{peltier}$ are bounded over time (as would be the case for a physical system), the series representation of their Laplace transforms can not contain any terms with inverse s. Therefore, for the purpose of predicting long-term behavior, their series representations are presumed to be constants, and are dropped from the Laplace transform representation. For a linear ramp of $T_{imu}$, its Laplace transform will be proportional to 1/s; let it be a/s, where a is a constant.

The behavior of $T_{imu}$ is then predicted for two cases: a PID controller and a PI²D controller. For a PID controller, the dominant term of H(s) as s approaches zero will be of the form k/s, where k is a constant. Ignoring all other terms of H(s):

$$T_{imu}(s) = \frac{\left(\frac{a}{s}\right) \cdot C_{amb} + T_{setpoint} \cdot C_{peltier} \cdot \left(\frac{k}{s}\right)}{1 + C_{peltier} \cdot \left(\frac{k}{s}\right)}$$

$$T_{imu}(s) = \frac{a \cdot C_{amb} + T_{setpoint} \cdot C_{peltier} \cdot k}{s + C_{peltier} \cdot k}$$

The limit of $T_{imu}(s)$ as s approaches zero is:

$$\lim_{s \to 0} \{T_{imu}(s)\} = \frac{a \cdot C_{amb}}{C_{peltier} \cdot k} + T_{setpoint}$$

This shows there is a finite offset that depends on the four parameters shown in the offset term.

For a PI²D controller, the dominant term of H(s) as s approaches zero will be of the form k/s², where k is a constant. Ignoring all other terms of H(s), we find:

$$T_{imu}(s) = \frac{\left(\frac{a}{s}\right) \cdot C_{amb} + T_{setpoint} \cdot C_{peltier} \cdot \left(\frac{k}{s^2}\right)}{1 + C_{peltier} \cdot \left(\frac{k}{s^2}\right)}$$

$$T_{imu}(s) = \frac{a \cdot C_{amb} \cdot s + T_{setpoint} \cdot C_{peltier} \cdot k}{s^2 + C_{peltier} \cdot k}$$

The limit of Timu(s) as s approaches zero is:

$$\lim_{s \to 0} \{T_{imu}(s)\} = T_{setpoint}$$

Therefore, for a linear ambient temperature ramp, a PI²D controller eliminates long-term bias.

PI2D Controller Laplace Transform

Assume the PI2D controller's standard coefficients are defined as follows:
Proportional coefficient=$C_p$
Integral coefficient=$C_i$
Double-integral coefficient=$C_{i2}$
Derivative coefficient=$C_d$ The Laplace transform of the PI2D controller's feedback gain when the duty cycle is above some threshold is:

$$H(s) = C_p + \frac{C_i}{s} + \frac{C_{i2}}{s^2} + C_d \cdot s$$

Gain Compensation for Duty-Cycle Dead-Time

Figure 8A:
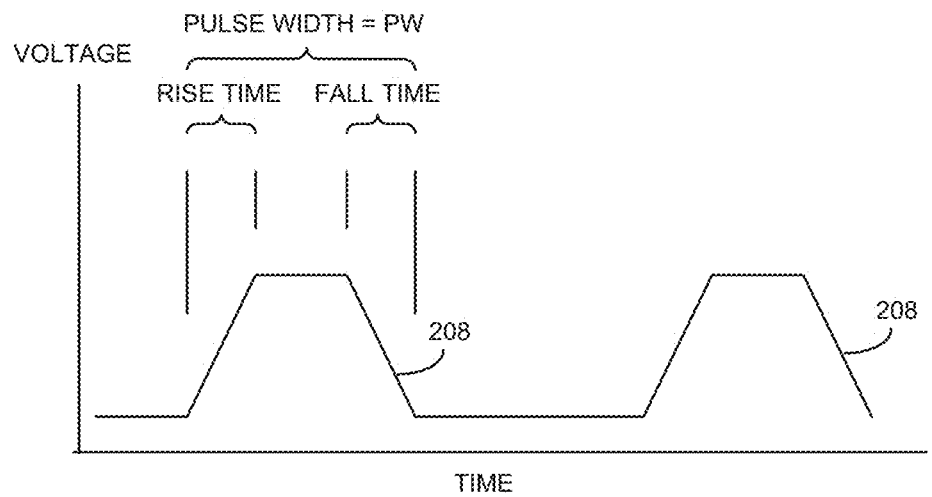
FIGS. 8A-8C show plus width modulated signals with different duty cycles.

FIG. 8A shows a waveform 208 with a reasonably large duty cycle generated by the PWM driver 130 in FIG. 1. Thermoelectric device 110 is responsive to current, which (on average) will be proportional to average voltage, which for waveform 208 is itself roughly proportional to the duty cycle. Note that the voltage does not rise and fall instantaneously, but experiences non-zero rise and fall times.

Figure 8B:
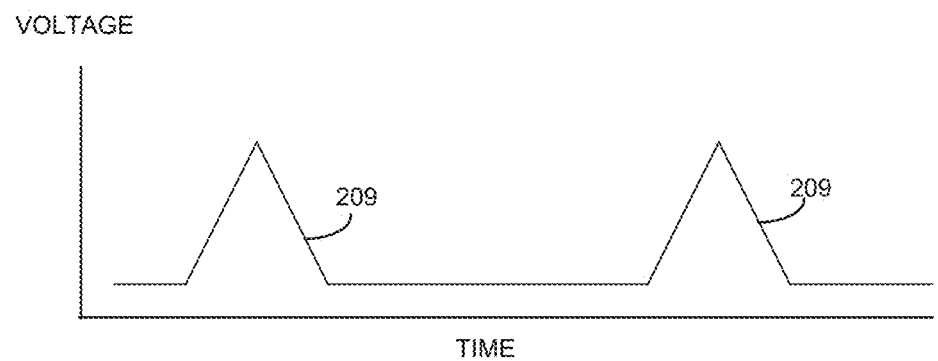

FIG. 8B shows a waveform with a smaller duty cycle, such that the voltage starts to fall as soon as it has risen completely. Assume the rise and fall of voltage are perfectly linear, and the sum of rise and fall time (i.e. width of each triangle 209) is denoted τ. The value of the duty cycle that produces waveform 209 is defined as $D_τ$ and the consequent average voltage is v.

Figure 8C:
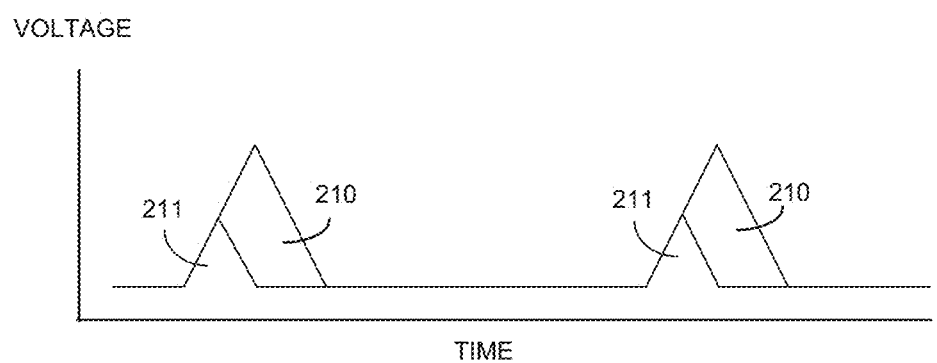

FIG. 8C shows a further reduction of the duty cycle to half of that shown in FIG. 8B. Area 210 shows the reduced voltage area. The peak voltage has been halved. However, the average voltage which is proportional to the area under triangular waveform 211 is now reduced to a quarter of the previous value in FIG. 8B, i.e. v/4. When the duty cycle creates a pulse width less than τ, the average voltage is proportional to the square of the duty cycle, instead of proportional to the duty cycle. This progressively reduces the loop gain as the duty cycle approaches zero.

FIG. 9 shows the effects of reduced duty cycle. The shape of curve 212 when $D<D_τ$ is quadratic (a parabola) and is proportional to D when $D>D_τ$. To compensate for the changes in curve 212, the PI2D coefficients are divided by duty cycle D when $D<D_τ$. The behavior smoothly-varies (i.e. continuous) as D traverses above or below $D_τ$. For example, PI2D controller 132 may use $C_i$ as the integral coefficient for $D>D_τ$, but use $C_i·D_τ/D$ for $D<D_τ$. Both these values have the same value ($C_i$) at $D=D_τ$.

The same approach may be used for the other PI2D coefficients. Note that for very small values of D, this adjustment may increase the coefficients by a correspondingly large amount. Given imperfections in system modeling, linearity, or implementation, this may add rather than reduce instability. Therefore, the gain coefficient adjustment may be limited to a particular ratio, such as 10:1 compared to the standard optimized values.

FIG. 10 shows a graph with a horizontal x-axis representing time in seconds and a vertical y-axis representing temperature in a thermal chamber in millidegrees Celsius. Multiple IMUs 118 were tested with thermal stabilization system 100. Line 210 represents the changes in the chamber temperature ramped between 9 C and 61 C.

FIG. 11 shows results in bias deviations for both an accelerometer and a gyroscope. The horizontal x axes represent degrees Celsius and the vertical y axes represent the maximum temperature interval error (MTIE). MTIE is the greatest deviation, between the minimum and maximum values experienced during that time interval, of the accelerometer or gyroscope output value, during a time interval during which the temperature deviated by up to a specified amount.

Graph 220A shows unsorted values for the accelerometer, graph 220B shows the sorted values for the accelerometer, graph 220C shows unsorted values for the gyroscope, and graph 220D shows sorted values for the gyroscope, where "sorting" refers to re-ordering of the dataset in order of increasing temperature. The x-axes represent a delta change in degrees Celsius, the y-axes in graphs 220A and 220B represent the accelerator output acceleration value due to gravity (g), and y-axes in graphs 220C and 220D represent the gyroscope output degrees per second (dps).

The unsorted values are calculated directly from raw data sets of output data generated by the accelerometer or gyroscope. The sorted values are calculated after sorting the data sets by increasing temperature. In this way, the sorted data sets include the effects of hysteresis. The Y-intercept of sorted graphs 220B and 220D show the deviation caused by hysteresis alone. The changes in curves 222A in graphs 220A and 220B represent the effects of temperature hysteresis that may cause a 0.05 g output uncertainty based on a rising temperature ramp vs. a falling temperature ramp.

Graphs 220 contain curves 222 for three cases. Curves 222A represent unstabilized outputs from the inertial units where thermal stabilization system 100 is not used. Curves 222B represent stabilized outputs from the inertial units where thermal stabilization system 100 is used except no Peltier drive compensation of sensor data is performed. Curves 222C represent compensated outputs from the inertial units where thermal stabilization system 100 is used and Peltier drive compensation of sensor data is performed.

As shown in graphs 220A and 220B, in one IMU 118, the stabilized accelerometer temperature sensitivity shown in curves 222B increases for delta Celsius exceeding about 30 C, but is greatly reduced by subsequent compensation as shown by curves 222C. This may be due to either temperature gradients within IMU 118 from imperfect insulation, or mechanical stress due to expansion/contraction of the Peltier device or thermal pad, or both. The gyroscope temperature sensitivity as shown in graphs 220C and 220D is greatly improved by stabilization alone, with essentially no further improvement by compensation as shown by curves 222C.

In some cases, polynomial regression based compensation may provide better results compared to simple linear regression based compensation. This may be due to a non-linear relationship between current and power in the system, either in thermoelectric device 110 or in drive circuit 130. Thus, either type of regression may be used.

Current drive circuit 130 may use H-bridge circuitry due to benefits of bi-directionality and efficiency. However, other types of current drive circuits 130 may be just as effective in some situations. Heat dissipated by current drive circuit 130 may be isolated from thermoelectric device 110 and IMU 118 by suitable heat sinking, insulation, and isolation.

Some temperature sensors external from the inertial devices 116 may have worse performance than temperature sensors provided within IMU 118. However, not all IMUs 118 contain temperature sensors, or include temperature sensors with a resolution necessary to properly stabilize the control loop. Therefore, some embodiments may include external temperature sensors.

Instead of compensating IMU data on the basis of drive current 160 as described above, compensation may be performed based on the measured temperature differences between IMU 118 and temperature sensors placed elsewhere within system 100. This temperature difference is similarly indicative or predictive of temperature gradients within IMU 118.

Placement of IMU 118 within an enclosure facilitates thermal coupling of IMU 118 to thermoelectric heating/cooling device 110 and reduces the power required to achieve a stable IMU temperature set point across a range of operating ambient temperatures. The enclosure also provides mechanical rigidity, coupling, and alignment of IMU 118 to a mounting surface. The enclosure also thermally isolates IMU 118 from adjacent heat-generating devices and can act as a heat spreader to maximize uniformity of the thermal environment around IMU 118. Thus, the enclosure may reduce thermal gradients within IMU 118, and in conjunction with a pliable thermal pad 114, limit the compressive force applied to IMU 118 by acting as a compression stop for thermoelectric device 110.

Box 112 may have different shapes in additional to the 5-sided box structure described above, such as a cylinder of arbitrary shape.

In one example, rather than just one thermoelectric device 110, there may be two or more thermoelectric devices 110 attached on various sides of box 112, such as on a top side of box 112 and one on a bottom side of box 112. Thermoelectric device 110 may be embedded within a cutout formed in PCB 119. IMU 118 then may be mounted directly on top of thermoelectric device 110.

Rather than supporting and pressing against thermoelectric device 110, box 112 may be partly or entirely composed of thermoelectric devices 110. For example, thermoelectric devices 110 may form sides, a bottom floor, and/or a top cover for box 112. Thermoelectric devices 110 may operate in conjunction with each other, and may be bonded or fastened together to form box 112 for IMU 118. Each individual thermoelectric device 110 may form one side of box 112, with a cold side aligned toward the interior space where IMU 118 is located. One or more heat sinks may contact the exterior hot sides of thermoelectric devices 110.

As stated above, IMU 118 may be removably inserted into a socket that operates as box 112. In another example, IMU 118 may be soldered directly to PCB 119. In this example, a separate box 112 may sit around IMU 118 as shown in FIG. 1 and PCB 119 may form the 5th bottom side of box 112.

Rather than using compression devices such as screws for assembly and mechanical integrity, IMU 118 and/or box 112 may be fixed in place with an adhesive, potting compound, or low-pressure overmolding material. The adhesive may maintain good thermal coupling, through thermal pad 114 to the cold side of thermoelectric device 110. This disclosure explicitly incorporates all these alternatives, and other similar ones which are obvious in consideration of them.

Computer, Software, and Control Systems

Examples of systems, apparatus, computer-readable storage media, and methods are being provided solely to add context and aid in the understanding of the disclosed implementations. It will thus be apparent to one skilled in the art that the disclosed implementations may be practiced without some or all of the specific details provided. In other instances, certain process or method operations, also referred to herein as "blocks," have not been described in detail in order to avoid unnecessarily obscuring the disclosed implementations. Other implementations and applications also are possible, and as such, the following examples should not be taken as definitive or limiting either in scope or setting.

References have been made to accompanying drawings, which form a part of the description and in which are shown, by way of illustration, specific implementations. Although these disclosed implementations are described in sufficient detail to enable one skilled in the art to practice the implementations, it is to be understood that these examples are not limiting, such that other implementations may be used and changes may be made to the disclosed implementations without departing from their spirit and scope. For example, the blocks of the methods shown and described above are not necessarily performed in the order indicated in some other implementations. Additionally, in some other implementations, the disclosed methods may include more or fewer blocks than are described. As another example, some blocks described herein as separate blocks may be combined in some other implementations. Conversely, what may be described herein as a single block may be implemented in multiple blocks in some other implementations. Additionally, the conjunction "or" is intended herein in the inclusive sense where appropriate unless otherwise indicated; that is, the phrase "A, B or C" is intended to include the possibilities of "A," "B," "C," "A and B," "B and C," "A and C" and "A, B and C."

Inertial navigation systems (INS) may include gyroscopic (gyro) sensors, accelerometers and similar technologies for providing outputs corresponding to the inertially-measured states of moving components in all possible axes (linear directions along and rotational about the X, Y and Z axes respectively). Said terminology will include the words specifically mentioned, derivative thereof and words of similar meaning.

Figure 12:
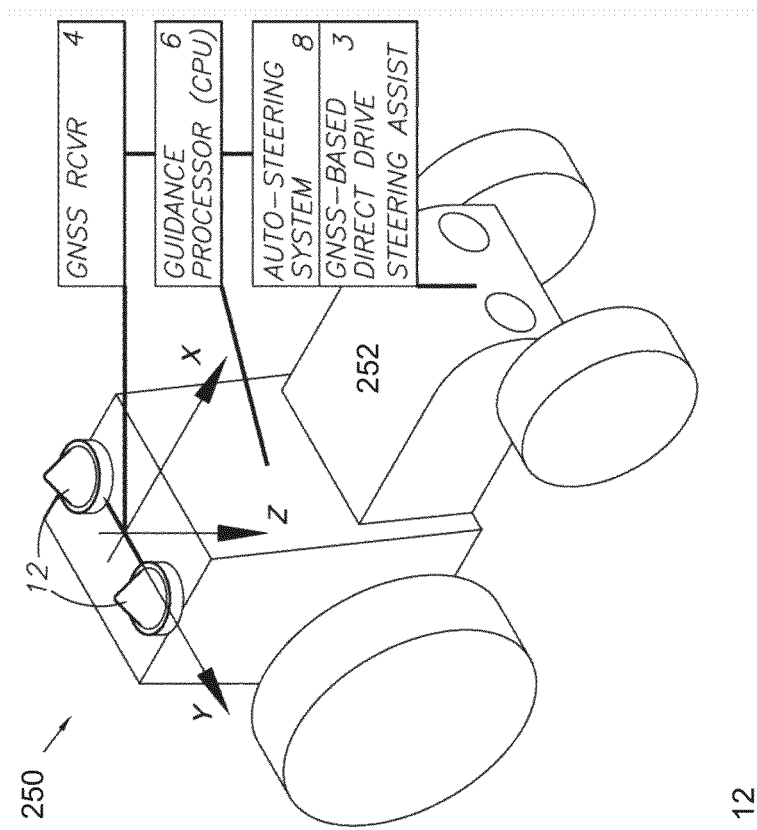
FIG. 12 shows a vehicle guidance system that may use the thermal stabilization system.

FIG. 12 shows a guidance system 250 implementing an electrical direct-drive steering assistance mechanism 3. Guidance system 250 may use thermal stabilization system 100 described above. Without limitation on the generality of useful applications of guidance system 250, a GNSS receiver 4 and a guidance processor 6 are connected to a GNSS antenna 12 and installed into vehicle 252, such as an agricultural vehicle or tractor. An auto-steering system 8 is electrically connected to guidance processor 6, and is mechanically interfaced with vehicle 252 via steering assistance mechanism 3.

Figure 13:
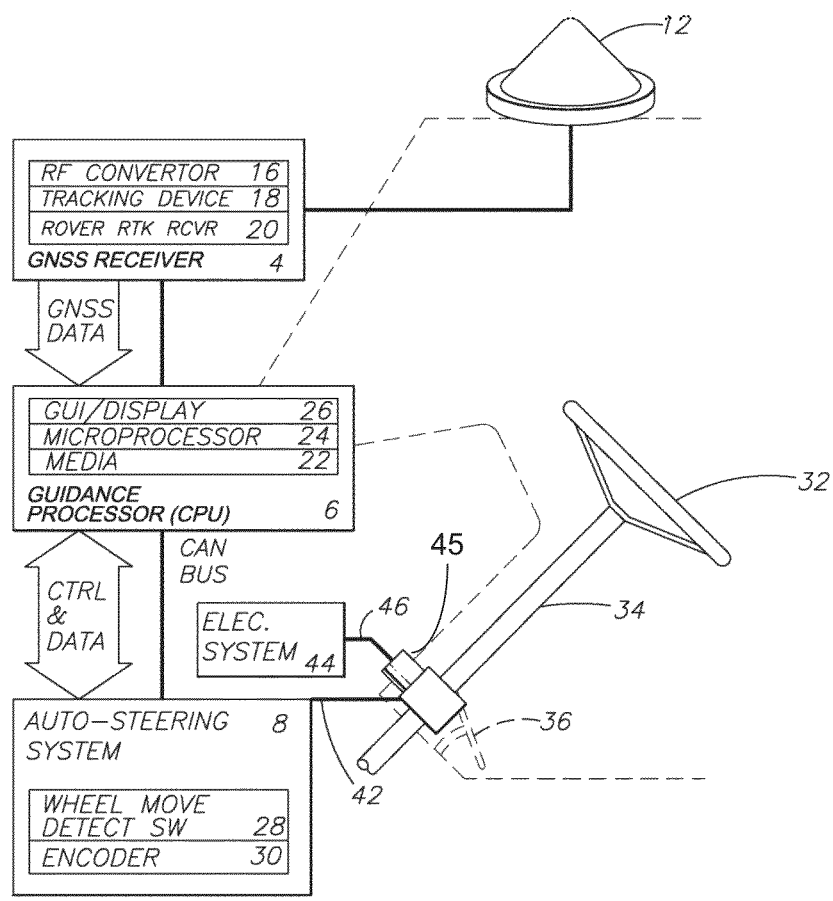
FIG. 13 shows the vehicle guidance system of FIG. 12 in more detail.

FIG. 13 shows additional detail of guidance system 250. The GNSS receiver 4 is further comprised of an RF convertor (i.e., down convertor) 16, a tracking device 18, and a rover RTK receiver element 20. The receiver electrically communicates with, and provides GNSS positioning data to, guidance processor 6. Guidance processor 6 includes a graphical user interface (GUI) 26, a microprocessor 24, and a media element 22, such as a memory storage drive. Guidance processor 6 electrically communicates with, and provides control data to auto-steering system 8. An auto-steering subsystem includes a wheel movement detection switch 28 and an encoder 30 for interpreting guidance and steering commands from CPU 6.

Auto-steering system 8 may interface mechanically with the vehicle's steering column 34, which is mechanically attached to steering wheel 32. A control line 42 may transmit guidance data from the CPU 6 to the auto-steering system 8. An electrical subsystem 44, which powers the electrical needs of vehicle 252, may interface directly with auto-steering system 8 through a power cable 46. Auto-steering subsystem 8 can be mounted to steering column 34 near the floor of the vehicle, and in proximity to the vehicle's control pedals 36. Alternatively, auto-steering system 8 can be mounted at other locations along steering column 34.

The auto-steering system 8 physically drives and steers vehicle 252 by actively turning steering wheel 32 via steering column 34. A motor 45 powered by vehicle electrical subsystem 44 may power a worm drive which powers a worm gear affixed to auto-steering system 8. In other embodiments, auto-steering system 8 is integrated directly into the vehicle drive control system independently of steering column 34.

Some of the operations described above may be implemented in software and other operations may be implemented in hardware. One or more of the operations, processes, or methods described herein may be performed by an apparatus, device, or system similar to those as described herein and with reference to the illustrated figures.

"Computer-readable storage medium" (or alternatively, "machine-readable storage medium") used in guidance system 250 may include any type of memory, as well as new technologies that may arise in the future, as long as they may be capable of storing digital information in the nature of a computer program or other data, at least temporarily, in such a manner that the stored information may be "read" by an appropriate processing device. The term "computer-readable" may not be limited to the historical usage of "computer" to imply a complete mainframe, mini-computer, desktop, wireless device, or even a laptop computer. Rather, "computer-readable" may comprise storage medium that may be readable by a processor, processing device, or any computing system. Such media may be any available media that may be locally and/or remotely accessible by a computer or processor, and may include volatile and non-volatile media, and removable and non-removable media.

Having described and illustrated the principles of a preferred embodiment, it should be apparent that the embodiments may be modified in arrangement and detail without departing from such principles. Claim is made to all modifications and variation coming within the spirit and scope of the following claims.

The invention claimed is:

1. A thermal stabilization system for stabilizing operation of an inertial measurement unit (IMU), the thermal stabilization system comprising:
   a thermoelectric device for stabilizing the temperature around the IMU;
   a controller configured to monitor a temperature around the thermoelectric device;
   a drive circuit configured to generate a pulse width modulated (PWM) drive signal to power the thermoelectric device based on the monitored temperature;
   the controller further configured to monitor a duty cycle of the generated PWM drive signal, the controller further configured to generate a control signal for controlling the drive circuit based on the monitored temperature and the monitored duty cycle of the generated PWM drive signal; and
   the controller further configured to vary gain coefficients for the monitored duty cycle of the generated PWM drive signal to compensate for a dead-band in the generated PWM drive signal.

2. The thermal stabilization system of claim 1, the controller further configured to increase loop gain coefficients for the control signal to compensate for a gain reduction that occurs when the monitored duty cycle of the generated PWM drive signal falls below a value dependent on at least one of a rise time and fall time of the generated PWM drive signal.

3. The thermal stabilization system of claim 1, the controller further configured to adjust loop gain coefficients for the control signal to compensate for a dead-band response associated with transitioning the thermoelectric device between heating and cooling operations.

4. A thermal stabilization system for stabilizing operation of an inertial measurement unit (IMU), the thermal stabilization system comprising:
   a thermoelectric device for stabilizing the temperature around the IMU;
   a drive circuit generating a drive signal for operating the thermoelectric device; and
   a controller monitoring a temperature around the thermoelectric device, the controller further monitoring a duty cycle for the generated drive signal used for operating the drive circuit, the controller generating a control signal for controlling the drive circuit based on the monitored temperature and the monitored duty cycle of the generated drive signal;
   the controller further configured to adjust loop gain coefficients for the control signal to compensate for a dead-band response associated with transitioning the thermoelectric device between heating and cooling operations; and
   the controller further configured to increase the loop gain coefficients by a correction factor inversely proportional to a most recent measurement of the monitored duty cycle of the generated drive signal.

5. The thermal stabilization system of claim 4, the controller further configured to apply a scale factor compensation value to the monitored duty cycle of the generated drive signal to compensate for different efficiencies of the thermoelectric device during the heating and cooling operations.

6. The thermal stabilization system of claim 4, the controller further configured to apply a dead-time compensation value to the monitored duty cycle of the generated drive signal to compensate for an increased duty cycle rate of change when the monitored duty cycle of the generated drive signal drops below a value dependent on at least one of a rise time and fall time of the generated drive signal.

7. The thermal stabilization system of claim 4, wherein the IMU is held in compression by the thermoelectric device so the IMU operates in a linear operating region.

8. The thermal stabilization system of claim 1, the controller further configured to change the gain coefficients by a correction factor that is based on a most recent measurement of the monitored duty cycle of the generated PWM drive signal.

9. The thermal stabilization system of claim 8, wherein the correction factor is inversely proportional to the most recent measurement of the monitored duty cycle of the generated PWM drive signal.

10. The thermal stabilization system of claim 8, the controller further configured to apply a scale factor compensation value to the monitored duty cycle of the generated PWM drive signal to compensate for different efficiencies of the thermoelectric device during the heating and cooling operations.

11. The thermal stabilization system of claim 8, the controller further configured to apply a dead-time compensation value to the monitored duty cycle of the generated PWM drive signal to compensate for an increased duty cycle rate of change when the monitored duty cycle of the generated PWM drive signal drops below a value dependent on at least one of a rise time and fall time of the generated PWM drive signal.

12. The thermal stabilization system of claim 1, wherein the IMU is held in compression by the thermoelectric device so the IMU operates in a linear operating region.

* * * * *